(12) United States Patent
Snider

(10) Patent No.: US 6,919,740 B2
(45) Date of Patent: Jul. 19, 2005

(54) MOLECULAR-JUNCTION-NANOWIRE-CROSSBAR-BASED INVERTER, LATCH, AND FLIP-FLOP CIRCUITS, AND MORE COMPLEX CIRCUITS COMPOSED, IN PART, FROM MOLECULAR-JUNCTION-NANOWIRE-CROSSBAR-BASED INVERTER, LATCH, AND FLIP-FLOP CIRCUITS

(75) Inventor: Greg Snider, Mountain View, CA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 133 days.

(21) Appl. No.: 10/355,850

(22) Filed: Jan. 31, 2003

(65) Prior Publication Data

US 2004/0149978 A1 Aug. 5, 2004

(51) Int. Cl.⁷ ............................................. H03K 19/20
(52) U.S. Cl. ............................. 326/134; 257/3; 257/9; 326/83; 326/136; 327/203; 327/210; 327/211; 716/12; 716/16
(58) Field of Search ........................... 257/3, 9; 326/83, 326/134, 136; 327/203, 210, 211; 716/12, 16, 3, 9

(56) References Cited

U.S. PATENT DOCUMENTS

| | | | | |
|---|---|---|---|---|
| 4,495,629 A | * | 1/1985 | Zasio et al. | 377/70 |
| 5,473,554 A | * | 12/1995 | Covey | 708/200 |
| 6,128,214 A | | 10/2000 | Kuekes et al. | |
| 6,211,702 B1 | * | 4/2001 | Nagatome | 326/83 |
| 6,256,767 B1 | | 7/2001 | Kuekes et al. | |
| 6,314,019 B1 | | 11/2001 | Kuekes et al. | |
| 6,417,711 B2 | * | 7/2002 | Fulkerson | 327/203 |
| 6,777,982 B2 | * | 8/2004 | Goldstein et al. | 326/134 |
| 2003/0200521 A1 | * | 10/2003 | DeHon et al. | 716/16 |

* cited by examiner

Primary Examiner—David Nelms
Assistant Examiner—Dao H. Nguyen

(57) ABSTRACT

Methods for implementing familiar electronic circuits at nanoscale sizes using molecular-junction-nanowire crossbars, and nanoscale electronic circuits produced by the methods. In one embodiment of the present invention, a 3-state inverter is implemented. In a second embodiment of the present invention, two 3-state inverter circuits are combined to produce a transparent latch. The 3-state inverter circuit and transparent-latch circuit can then be used as a basis for constructing additional circuitry, including master/slave flip-flops, a transparent latch with asynchronous preset, a transparent latch with asynchronous clear, and a master/slave flip-flop with asynchronous preset. 3-state inverters can thus be used to compose latches and flip-flops, and latches and flip-flops can be used, along with additional Boolean circuitry, to compose a wide variety of useful, state-maintaining circuits, all implementable within molecular-junction-nanowire crossbars by selectively configuring junctions within the molecular-junction-nanowire crossbars.

30 Claims, 21 Drawing Sheets

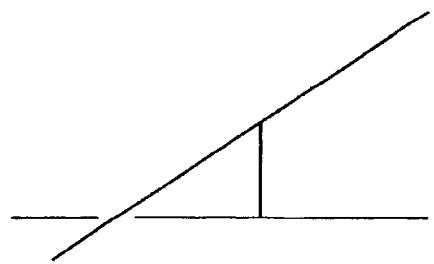
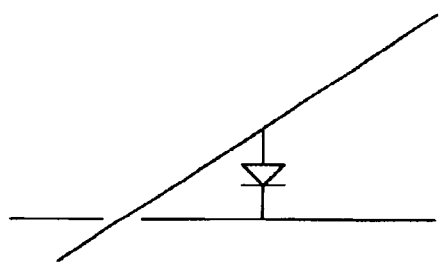
Figure 4A  Figure 4B
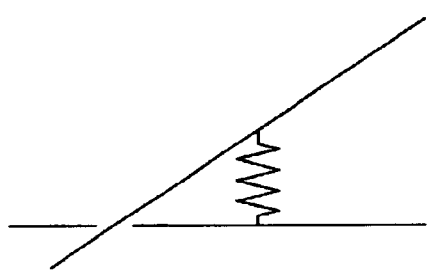
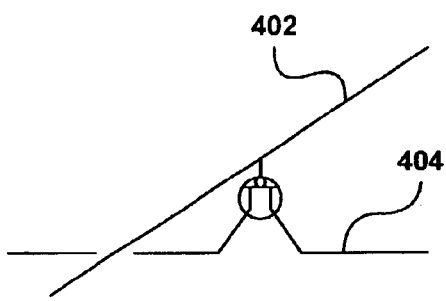
Figure 4C  Figure 4D
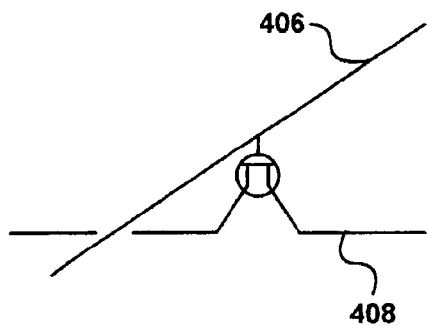
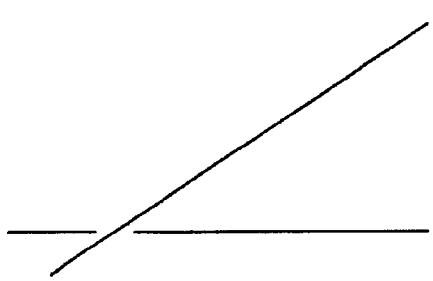
Figure 4E  Figure 4F

| D | G | $\overline{G}$ | Q |
|---|---|---|---|
| 1 | 1 | 0 | 1 |
| 0 | 1 | 0 | 0 |
| 1 | 0 | 1 | Q |
| 0 | 0 | 1 | Q |
| | | | |

MOLECULAR-JUNCTION-NANOWIRE-CROSSBAR-BASED INVERTER, LATCH, AND FLIP-FLOP CIRCUITS, AND MORE COMPLEX CIRCUITS COMPOSED, IN PART, FROM MOLECULAR-JUNCTION-NANOWIRE-CROSSBAR-BASED INVERTER, LATCH, AND FLIP-FLOP CIRCUITS

TECHNICAL FIELD

The present invention relates to electrical circuitry and, in particular, to programmanble, nanoscale-sized electrical circuits, including latches and flip-flops, configured from molecular-junction-nanowire crossbars that may be integrated with additional components in extremely dense electrical subsystems.

BACKGROUND OF THE INVENTION

During the past fifty years, the electronics and computing industries have been relentlessly propelled forward by the ever decreasing sizes of basic electronic components, such as transistors and signal lines, and by the correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Not only must expensive semiconductor fabrication facilities be rebuilt in order to use the new techniques, many new obstacles are expected to be encountered. For example, it is necessary to construct semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor services decrease, resulting in an increasing proportion of defective devices during manufacture, and a correspondingly lower yield of useful product. Ultimately, various quantum effects that arise only at molecular-scale distances may altogether overwhelm current approaches to component construction in semiconductors.

In view of these problems, researchers and developers have expended considerable research effort in fabricating microscale and nanoscale electronic devices using alternative technologies, where nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits. Even were such straightforwardly miniaturized circuits able to feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

With the ability to selectively fabricate simple electronic components, including transistors, resistors, diodes, and other simple components, at molecular-junction-nanowire crossbar points, it becomes desirable to combine selectively fabricated electrical components to produce useful electronic circuitry, including latches, flip-flops, and other such circuits. Designers, manufacturers, and users of microelectronic devices and integrated circuits have thus recognized the need for nanoscale implementations of familiar electronic circuitry. Unfortunately, the current methods by which such circuitry is fabricated are not amenable to simple miniaturization using nanowire-based structures similar to those currently employed at larger dimensions. Instead, designers, manufacturers, and users of devices that include such circuitry have recognized the need for new methods for implementing familiar electronic circuitry that are useable at nanoscale dimensions. Moreover, to facilitate reuse and flexibility of this circuitry, designers, manufacturers, and users of devices that include the circuitry have recognized the need for reprogrammable circuits that can be reconfigured for alternative uses or to enhance the devices in which they are included.

SUMMARY OF THE INVENTION

The present invention provides techniques for implementing familiar electronic circuits at nanoscale sizes using molecular-junction-nanowire crossbars. In one embodiment of the present invention, a 3-state inverter is implemented. In the second embodiment of the present invention, two 3-state inverter circuits are combined to produce a transparent latch. The 3-state inverter circuit and transparent-latch circuit can then be used as a basis for composing additional circuitry, including master/slave flip-flops, a transparent latch with asynchronous preset, a transparent latch with asynchronous clear, and a master/slave flip-flop with asynchronous preset. Thus, 3-state inverters can be used to compose latches and flip-flops, and latches and flip-flops can be used, along with additional Boolean circuitry, to compose a wide variety of useful, state-maintaining circuits. The 3-state inverters, latches, flip-flops, and other, more complex state-maintaining circuits can all be implemented within molecular-junction-nanowire crossbars by selectively configuring junctions within the molecular-junction-nanowire crossbars.

Molecular-junction-nanowire crossbars are quite defect and fault tolerant, and can be configured using a variety of different topologies. Molecular-junction-nanowire crossbar implementations of circuits consume very little power, and have extremely high densities. These extremely dense circuits can then be combined into extremely dense subsystems that include many additional electrical components, implemented within a set of complementary/symmetry ("CS")

lattices. Thus, rather than simply representing a miniaturization of existing electronic circuits, in isolation, the present invention provides for building electronic circuits into complex subsystems having transistor densities equal to, or greater than, 1 billion transistors/cm$^2$ or, in other words, having 1.0 giga-transistor/cm$^2$ densities and greater transistor densities.

BRIEF DESCRIPTION OF THE DRAWINGS

FIG. 4 schematically illustrates a number of simple electrical components that can be programmed at the junctions of nanowires in molecular-junction-nanowire crossbars.

DETAILED DESCRIPTION OF THE INVENTION

As discussed below, molecular-junction-nanowire crossbars represent one of a number of emerging nanoscale electronic circuit configuration media that can be used to construct nanoscale electronic circuits. Various techniques have been developed to selectively configure different types of electronic components, such as transistors, resistors, diodes, and conductions, at the junctions between the conductive paths at two different layers of a molecular-junction-nanowire crossbar. The present invention provides methods for configuring more complex, familiar electronic circuits using selective configuration of simple electronic components within molecular-junction-nanowire crossbars. In a first subsection, below, molecular-junction-nanowire crossbars are described. In a second subsection, a number of embodiments of the present invention that employ molecular-junction-nanowire-crossbar technology are described.

Molecular-Junction-Nanowire Crossbars

Figure 1:
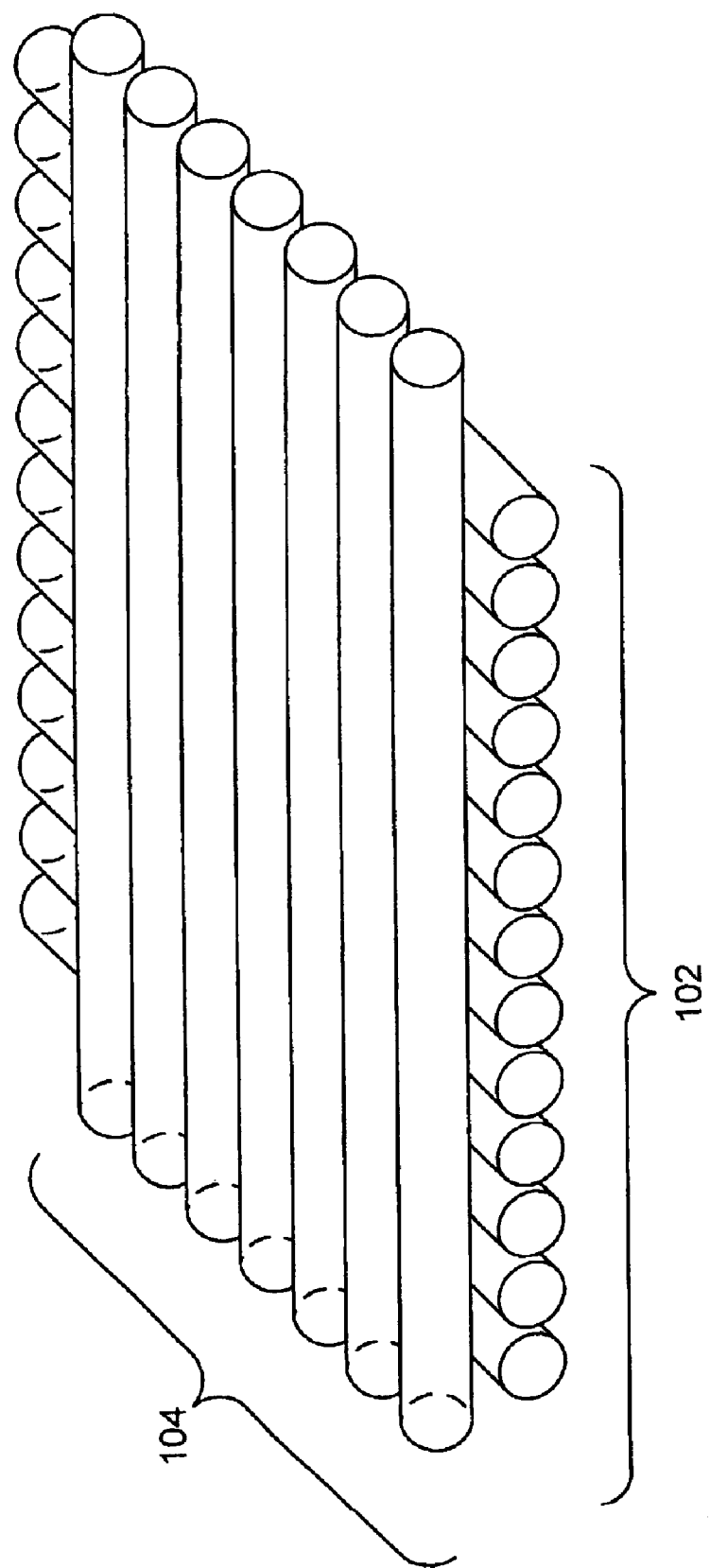
FIG. 1 illustrates a basic molecular-junction-nanowire crossbar.

A relatively new and promising alternative technology involves molecular-junction-nanowire crossbars. FIG. 1 illustrates a molecular-junction-nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at intersection points, or junctions that represent the closest contact between two nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-dimensional molecular-junction-nanowire crossbar comprising first and second layers, as shown in FIG. 1, can be manufactured via a relatively straightforward process. Many different types of conductive and semi-conductive nanowires can be chemically synthesized from metallic and semi-conductor substances, from combinations of these types of substances, and from other types of substances. A molecular-junction-nanowire crossbar may be connected to microscale signal-line leads or other electronic leads through a variety of different methods to incorporate the nanowires into electrical circuits.

Figure 2:
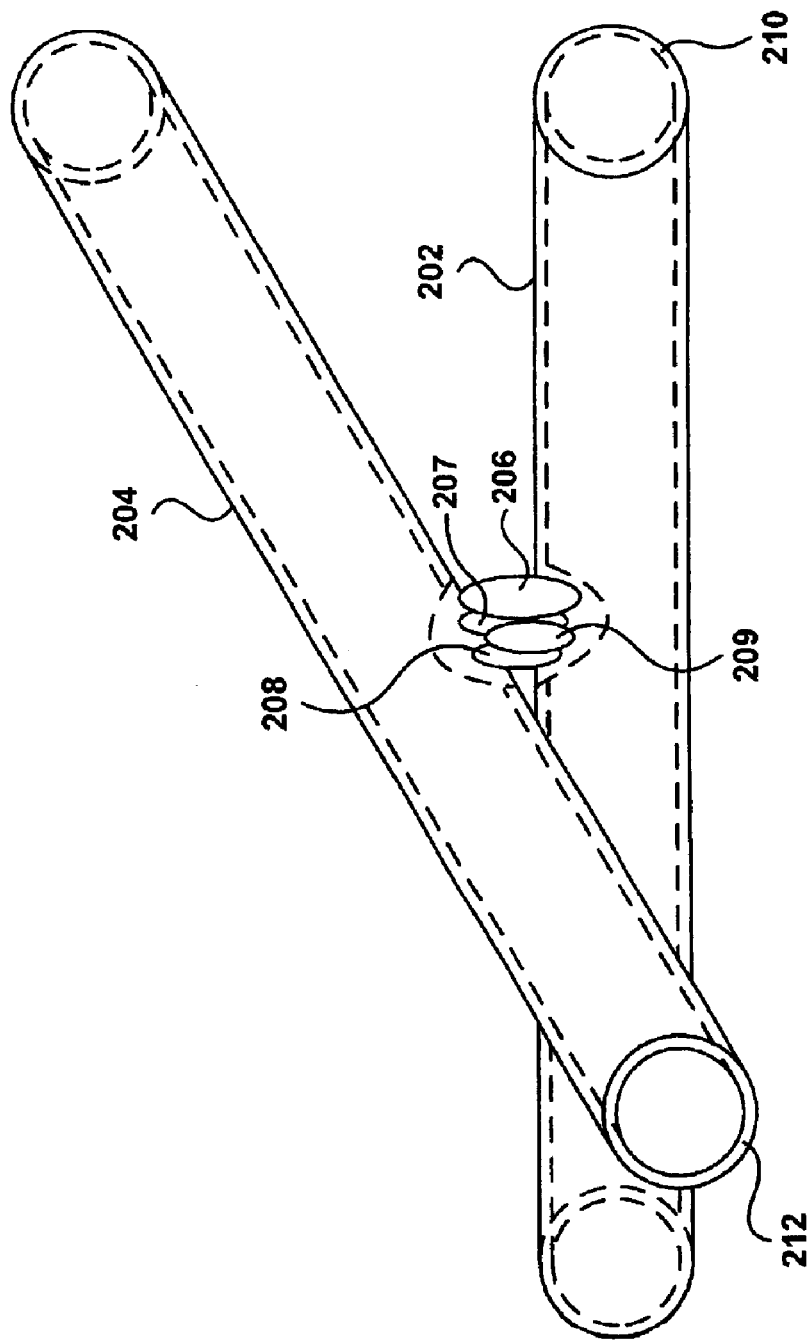
FIG. 2 illustrates a junction, or intersection, between two roughly orthogonal nanowires.
Figure 3A:
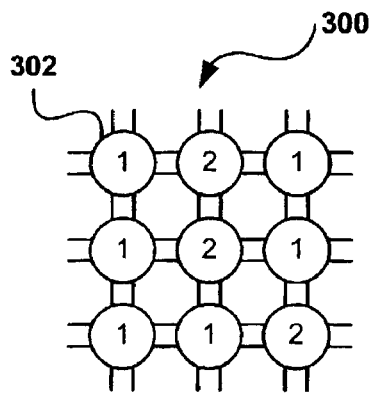
FIG. 3 illustrates one possible approach for configuring a network of nanoscale electrical components from a two-dimensional molecular-junction-nanowire crossbar.
Figure 3B:
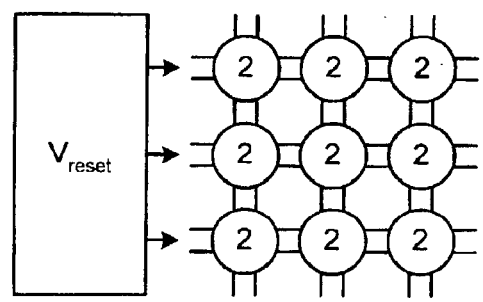
Figure 3C:
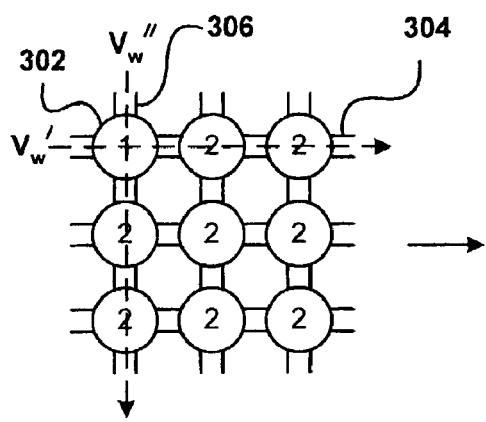
Figure 3D:
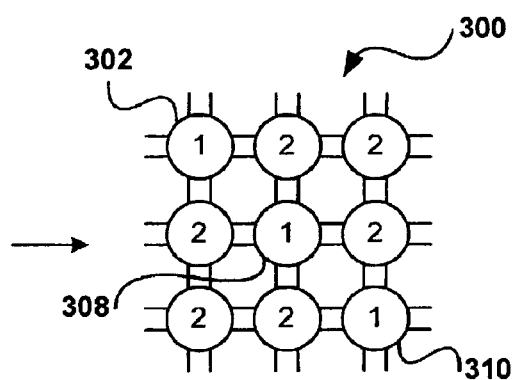
Figure 3E:
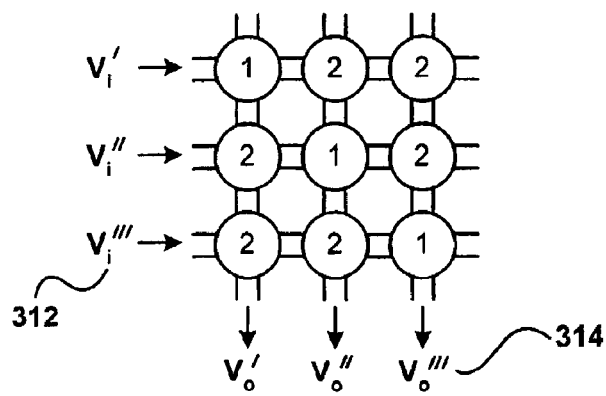

Molecular-junction-nanowire crossbars are not only layers of parallel conductive elements, but may also be used to create arrays of nanoscale electronic components, such as transistors, diodes, resistors, and other familiar basic electronic components. FIG. 2 illustrates a junction between nanowires of two contiguous layers within a molecular-junction-nanowire crossbar. In FIG. 2, the junction between a first nanowire 202 of a first nanowire layer intersects a second nanowire 204 of a second nanowire layer. Note that the junction may or may not involve physical contact between the two nanowires 202 and 204. As shown in FIG. 2, the two nanowires are not in physical contact at their closest point of approach, but the gap between them is spanned by a small number of molecules 206–209. Various different types of molecules may be introduced at junctions for a variety of different purposes. In many cases, the molecules of a junction may be accessed, for various purposes, through different voltage levels or current levels placed on the nanowires forming the junction. The molecules spanning the junction in FIG. 2 may have various different quantum states in which the molecules exhibit resistive, semiconductor-like, or conductive electrical properties. The current passing between the two nanowires intersecting at a junction may be a nonlinear function of the voltage across the junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a molecular junction is anisotropic, having a polarity or direction with respect to physical properties, including electrical properties. This anisotropy may arise from different chemical and/or physical properties of nanowires in the two layers of a molecular-junction-nanowire crossbar, may arise from asymmetries of junction molecules combined with junction molecules being uniformly-oriented with respect to the nanowire layers, and may arise both from differences in the properties of the nanowires as well as junction-molecule asymmetries. The fact the molecular junctions may have polarities allows for controlling junction properties by applying positive and negative voltages to molecular junctions, eliciting forward and reverse currents within the molecular junctions.

As shown in FIG. 2, the nanowires may include outer coatings, such as outer coatings 210 and 212. The outer coatings may serve to insulate nanowires from one another, may constitute the molecules that serve to span junctions when the nanowires are placed in contact with one another, or may serve as modulation-dopant-layers, which can be selectively activated to dope semiconductor nanowires. Both p-type and n-type modulation dopant coatings have been developed. In other applications, the molecules spanning junctions between crossing nanowires may be introduced as a separate layer formed between layers of nanowires. In some cases, the state changes of junction molecules may not be reversible. For example, the junction molecules may initially be resistive, and may be made conductive through application of relatively high voltages. In other cases, the junction molecules may be conductive, but the molecules may be irreversibly damaged, along with portions of the nanowires proximal to the junctions, through application of very high voltage levels, resulting in disrupting conductivity between the two nanowires and breaking electrical connection between them. In yet other cases, the junction molecules may transition reversibly from one state to another and back, so that the nanoscale electrical components configured at nanowire junctions may be reconfigured, or programmed, by application of differential voltages to selected nanowire junctions.

FIG. 3 illustrates one possible approach to configuring a network of reconfigurable nanoscale electrical components from a two-dimensional molecular-junction-nanowire crossbar. In FIGS. 3A–E, a small 3×3 molecular-junction-nanowire crossbar is shown, with circles at all nine junctions to indicate the state of the junction molecules. In one state, labeled "1" in FIGS. 3A–E, the junction molecules may have certain semiconductor, or conductive properties, while in a second state, labeled "2" in FIGS. 3A–E, junction molecules may have different properties. Initially, as shown in FIG. 3A, the states of the junctions of the molecular-junction-nanowire crossbar 300 are indeterminate. In other words, as shown in FIG. 3A, the states of the junctions, such as junction 302, are randomly distributed between state "1" and state "2." Next, as shown in FIG. 3B, a reset voltage "$v_{reset}$," often either a relatively large positive or negative voltage, is applied to all junctions in order to uniformly set the states of all junctions to a particular state, in the case shown in FIG. 3B, state "2." Next, as shown in FIG. 3C, each junction may be uniquely accessed by applying a write voltage, or configuring voltage, to the nanowires that form the junction in order to configure, or program, the junction to have the state "1." For example, in FIG. 3C, a first write voltage $v_{w'}$ is applied to horizontal nanowire 304 and a second write voltage $v_{w''}$ is applied to vertical nanowire 306 to change the state of the junction from "2" to "1." Individual junctions may be configured through steps similar to the steps shown in FIG. 3C to finally result in a fully configured nanoscale component network as shown in FIG. 3D. Note that, in FIG. 3D, the states of junctions 302, 308, and 310 that form a downward-slanted diagonal through the molecular-junction-nanowire crossbar have been configured by selective application of write voltages. Finally, as shown in FIG. 3E, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the write voltages $v_w$ and the reset voltages $v_{reset}$. Should the integrated circuit need to be reconfigured, the reset voltage $v_{reset}$ may be again applied to the molecular-junction-nanowire crossbar, as in FIG. 3B, and the device reconfigured, or reprogrammed, as shown in steps in FIGS. 3C–3D. Depending on the types of nanowires, types of dopants employed in the case of semiconductor nanowires, and the types of junction molecules employed in the molecular-junction-nanowire crossbar, many different, but similar configuring processes may be used to configure molecular-junction-nanowire crossbars into nanowire-based electrical components networks. The example of FIG. 3 is meant to illustrate a general process by which molecular-junction-nanowire crossbars may be configured as useful portions of electronic circuits.

Junctions of nanowires in molecular-junction-nanowire crossbars may be configured, in various techniques depending on the chemical nature of the nanowires and junction-spanning molecules, to form a wide variety of different, simple electronic devices. FIG. 4 schematically illustrates a number of simple electrical components that can be configured at the junctions of nanowires in molecular-junction-nanowire crossbars. A junction may represent (1) a simple conductive connection between the two nanowires, as shown in FIG. 4A; (2) a diode that conducts current in only one direction between the two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the crossing of two conductive nanowires, with the voltage and current associated with each nanowire completely independent from one another, as shown in FIG. 4F. In the case of the nFET, shown in FIG. 4D, a relatively low voltage state on the gate wire 402 results in current passing through the source/drain wire 404, while a relatively high voltage on the gate wire 402 prevents conduction of current on the source/drain nanowire 404. The pFET of FIG. 4E exhibits opposite behavior, with high voltage on the gate wire 406 facilitating flow of current through the source/drain wire 408, and low voltage on the gate wire 406 preventing flow of current on the source/drain wire 408. Note also that a junction may also be configured as an insulator, essentially interrupting conduction at the junction with respect to both nanowires. Thus, as discussed above with reference to FIGS.

1–4, a two-dimensional molecular-junction-nanowire crossbar may be constructed and then configured as a network of electrical components. Note also that a junction, although shown in FIGS. 4A–F to comprise the junction of two single nanowires, may also comprise a number of junctions between a number of wires in a first layer of a molecular-junction-nanowire crossbar that together comprise a single conductive element and the nanowires in a second nanowire layer that together comprise a second conductive element.

The configurable electrical resistance of molecular junctions is an important and special property of molecular junctions. When certain types of molecules are used for molecular junctions, the initially relatively high resistance of the molecular junction may be lowered by applying a relatively large positive voltage to the molecular junction. The resistance of the molecular junction is generally a function of the magnitude of the highest voltage applied to the junction. By applying higher and higher positive voltages to a junction, the resistance of the junction can be made lower and lower. A relatively low resistance state achieved by application of a positive voltage may be reversed by applying a sufficiently high, negative voltage. Thus, not only is the electrical resistance of a molecular junction configurable, the electrical resistance may also be reconfigurable, depending on the type of molecules forming the molecular junction.

Figure 5:
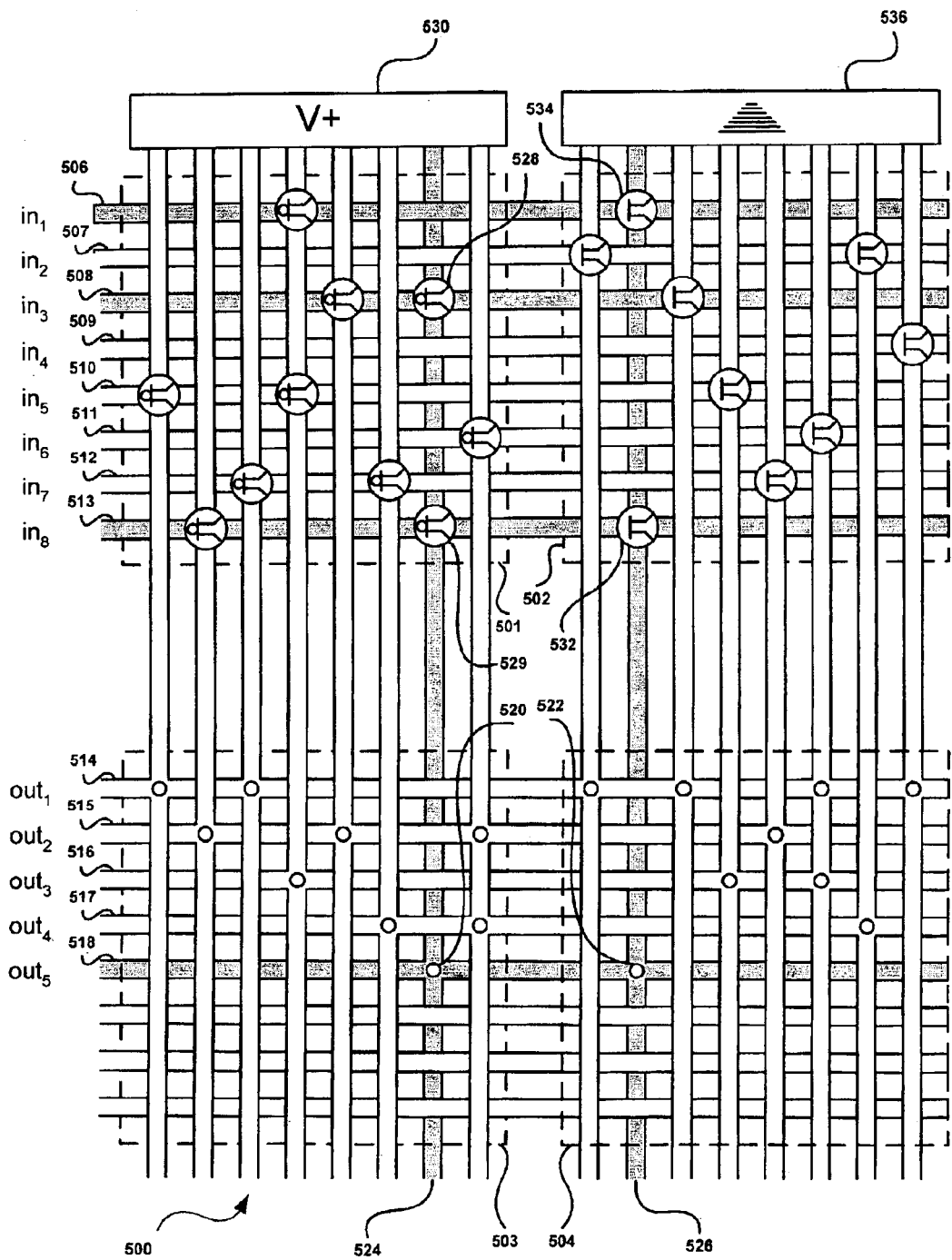
FIG. 5 illustrates an exemplary CS lattice.

A particularly useful type of nanoscale electronic component array based on molecular-junction-nanowire-crossbar technology is referred to as a "complementary/symmetry lattice" ("CS lattice"). FIG. 5 illustrates an exemplary CS lattice. Note that, although CS lattices are generally configured to represent logical and useful circuits, the CS lattice in FIG. 5 is rather arbitrarily configured, and is shown not as a representation of a particular subcircuit implemented by the CS lattice, and may not even be useful or functional, but rather is included to show the basic features of the CS lattice itself. In general, because of the small scales of the molecular-junction-nanowire-crossbar grids, it is difficult to chemically alter individual junctions. Techniques do exist for applying a very small number of molecules to a particular junction, but the techniques are painstakingly time consuming, and unsuitable for mass production. However, it is currently relatively straightforward to chemically alter subregions or microregions, comprising a number of junctions using currently available semiconductor manufacturing technologies. The term "microregion" is meant to indicate a scale larger than an individual molecular junction, but not necessarily a particular range of dimensions. It is current technically feasible to fabricate sub-mircon-sized microregions, for example. In the exemplary CS lattice shown in FIG. 5, four distinct, square microregions, demarcated by dashed lines 501–504, are shown within the molecular-junction-nanowire crossbar 500. Microregion 501 is chemically altered so that junctions within microregion 501 may be selectively configured as nFET components. Conversely, microregion 502 has been chemically altered so that junctions within subregion 502 may be selectively configured as pFET components. The microregions 503 and 504 have been chemically configured so that junctions within microregions 503 and 504 can be selectively configured as conductive links that electrically connect the nanowires forming the junctions. In certain embodiments, one set of parallel wires, the horizontal, conductive nanowires in FIG. 5, may be of nanoscale dimensions or of greater, sub-mircoscale or microscale dimensions, while the other set of parallel wires, the vertical semiconductive nanowires in FIG. 5, need to be of nanoscale dimensions in order for a CS-lattice-based circuit to properly function.

In a CS lattice, some number of nanowires is considered as a set of molecular input-signal lines. For example, in the CS lattice shown in FIG. 5, horizontal nanowires 506–513 are considered as inputs, and labeled "$in_1$"–"$in_8$." Similarly, a distinct set of wires is normally considered as a set of molecular output-signal lines. For example, in the CS lattice shown in FIG. 5, horizontal nanowires 514–518 are considered as molecular output-signal lines, and designated in FIG. 5 as "$out_1$"–"$out_5$." Consider, for example, molecular output-signal line, or horizontal nanowire, "$out_5$" 518. Proceeding along nanowire "$out_5$" 518 from left to right, it can be seen that molecular output-signal line "$out_5$" is connected via junction connections 520 and 522, denoted by small circles in the junctions, to vertical nanowires 524 and 526, respectively. Traversing these vertical nanowires 524 and 526, it can be seen that vertical wire 524 is connected with molecular input-signal line "$in_3$" 508 via an nFET 528 and connected with molecular input-signal line "$in_5$" 513 via an nFET 529. Thus, when molecular input-signal lines "$in_3$" 508 and "$in_5$" 513 are low, the nFETs 528 and 529 are activated to connect molecular output-signal line "$out_5$" with a high voltage source 530, potentially driving molecular output-signal line "$out_5$" to a high-voltage state. However, following vertical nanowire 526 upwards from the connection 522 to molecular output-signal line "$out_5$" 518, it can be seen that the vertical nanowire 526 interconnects with molecular input-signal line "$in_8$" 513 via a pFET 532 and interconnects with molecular input-signal line "$in_1$" 506 via pFET 534. Whenever molecular input-signal lines "$in_1$" and "$in_8$" are both in a high-voltage, or ON, state, then the pFETs 532 and 534 are activated to interconnect the vertical nanowire 526 with ground 536, essentially shorting vertical nanowire 526 and molecular output-signal line "$out_5$" 518 to ground. When molecular input-signal lines "$in_1$" and "$in_8$" are high, or ON, molecular output-signal line "$out_5$" 518 is low, or OFF. When both of molecular input-signal lines "$in_1$" and "$in_8$" are not high, or ON, and both molecular input-signal lines "$in_3$" and "$in_5$" are not low, or OFF, then molecular output-signal line "$out_5$" is undriven, and in a high impedance state. Thus, the state of molecular output-signal line "$out_5$" 518 depends only on the states of molecular input-signal lines "$in_1$," "$in_3$," and "$in_8$," and a truth table summarizing the response of molecular output-signal line to all possible input-signal-line-states can be provided as follows:

| $in_1$ | $in_3$ | $in_8$ | $out_5$ |
|---|---|---|---|
| 0 | 0 | 0 | 1 |
| 0 | 0 | 1 | 1 |
| 0 | 1 | 0 | high Z |
| 0 | 1 | 1 | high Z |
| 1 | 0 | 0 | 1 |
| 1 | 0 | 1 | 0 |
| 1 | 1 | 0 | high Z |
| 1 | 1 | 1 | 0 |

Various different types and sizes of CS lattices are possible. The configuration of CS lattices is constrained only by the fact that there is a minimum area of a molecular-junction-nanowire crossbar to which discrete types of chemically modifying agents can be applied, by direct deposit, by photolithographic methods, or by other methods. Thus, CS lattices comprise blocks of sublattices, or microregions, within which one or a small number of different types of nanoscale electrical components can be selectively created at nanowire junctions.

While a brief introduction to nanowire lattices has been provided, above, more detailed information is available in a number of patent applications and issued patents. Additional information may be obtained from: Kuekes, et al., U.S. Pat. No. 6,314,019B1; Kuekes, et al., U.S. Pat. No. 6,256,767B1; Kuekes, et al., U.S. Pat. No. 6,128,214; and Snider, et al., U.S. patent application Ser. No. 10/233,232.

Embodiments of the Present Invention

Figures 6A, 6B:
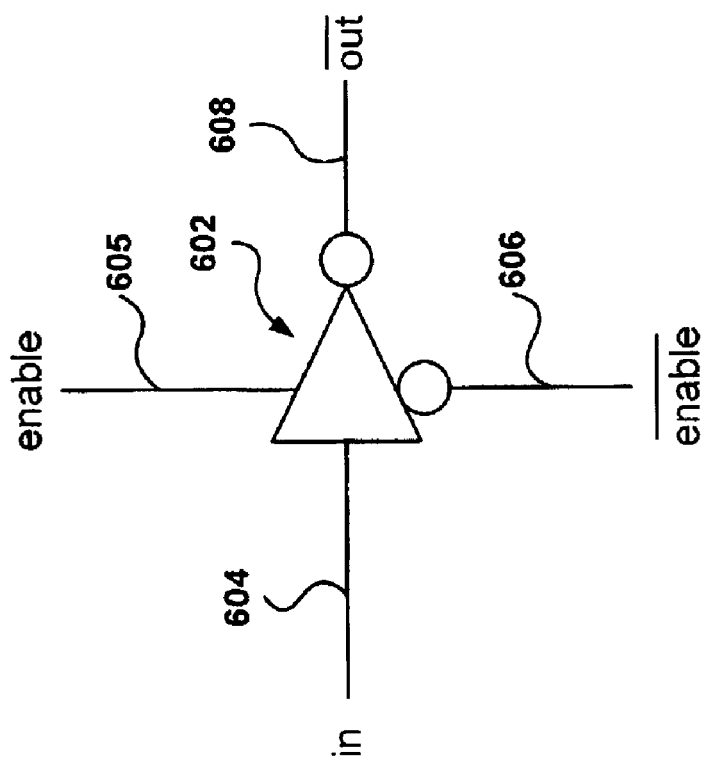
FIGS. 6A–6B describe a 3-state inverter.

FIGS. 6A–B describe a 3-state inverter. FIG. 6A shows a schematic rendering of a 3-state inverter, and FIG. 6B is a truth table showing the output signal from a 3-state inverter produced by different possible input values. As can be seen in FIG. 6A, a 3-state inverter 602 receives an input signal 604 as well as an enable signal line 605 and its complement enable 606. Based on the values of the input signal "in" and the complementary values of the enable and enable input signal lines, a "0," "1," or undriven, high-Z state is produced on the output signal line 608. As can be seen in the truth table shown in FIG. 6B, when the state of the enable signal line is "1," or ON, and the enable-complement signal line enable is "0," or OFF, the 3-state inverter inverts the input signal line "in" to the output signal line out. When the input signal line "in" is "1," then the 3-state inverter outputs "0." Conversely, when the state of the input signal line is "0," the 3-state inverter outputs "1." When the states of the enable and enable-complement signal lines are reversed, the output signal line is undriven, and in a high impedance state, shown in FIG. 6B as "high Z."

Figure 7:
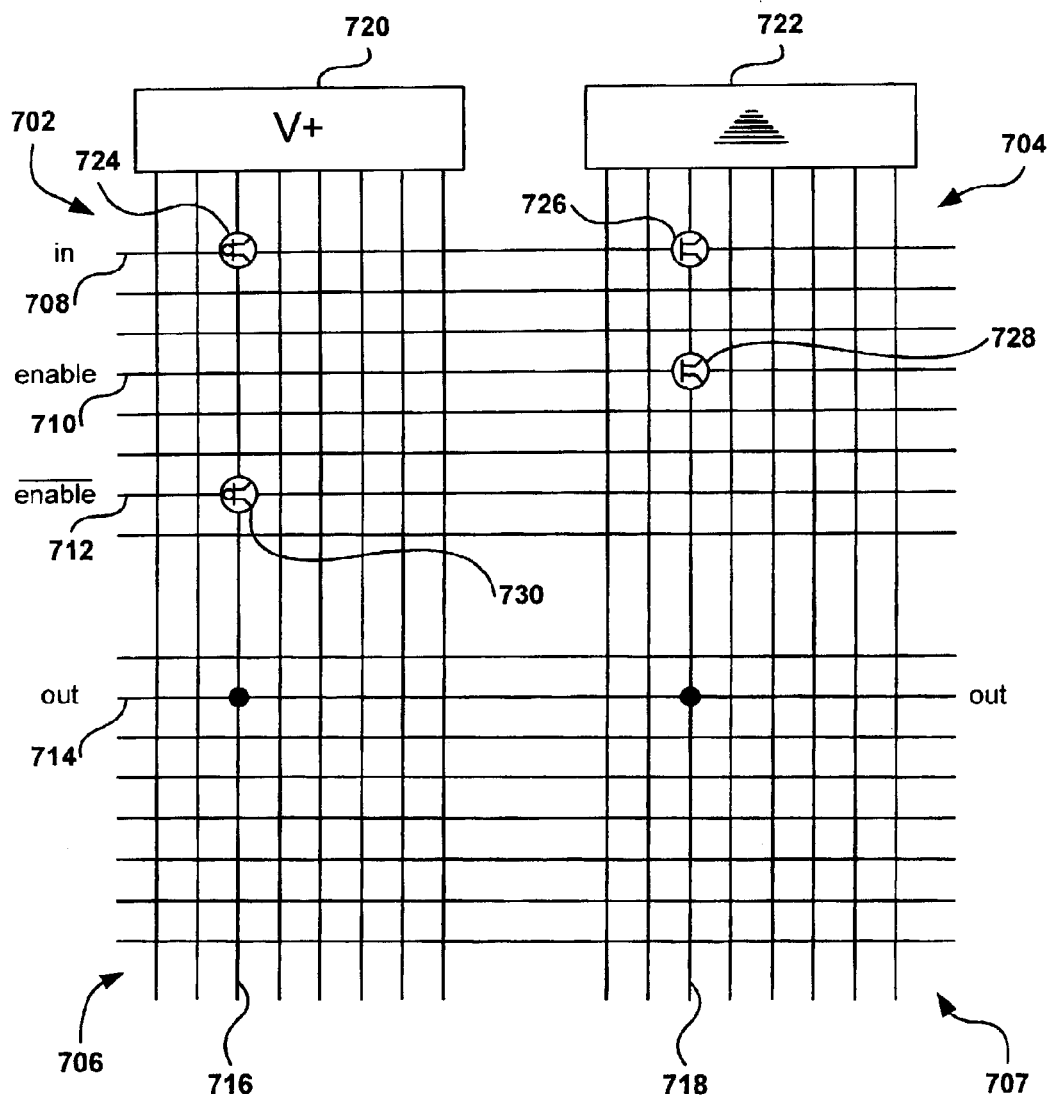
FIG. 7 shows an implementation of a 3-state inverter in a CS lattice.

FIG. 7 shows an implementation of a 3-state inverter in a complementary/symmetry lattice ("CS lattice"). The top, left-hand microregion 702 is prepared for selective configuration of nFETs, the top right-hand microregion 704 is prepared for selective configuration of pFETs, and the bottom two microregions 706 and 707 are prepared for selective configuration of connections. Three horizontal nanoscale signal lines, or nanowires, 708, 710, and 712 are chosen for the input signal lines "in," "enable," and "enable-complement," respectively. A fourth horizontal nanowire 714 is chosen for the output signal line out. Two vertical nanowires 716 and 718 are chosen for potentially interconnecting the output signal line out 714 with a high voltage source 720 and with ground 722. The input signal line "in" is potentially connected to these two vertical nanowires 716 and 718 via an nFET 724 and a pFET 726. The input signal line enable is potentially interconnected with the second vertical nanowire 718 by a selectively configured pFET 728, and its complement input signal line enable is potentially connected to the first vertical nanowire 716 via a selectively configured nFET 730.

Figure 8:
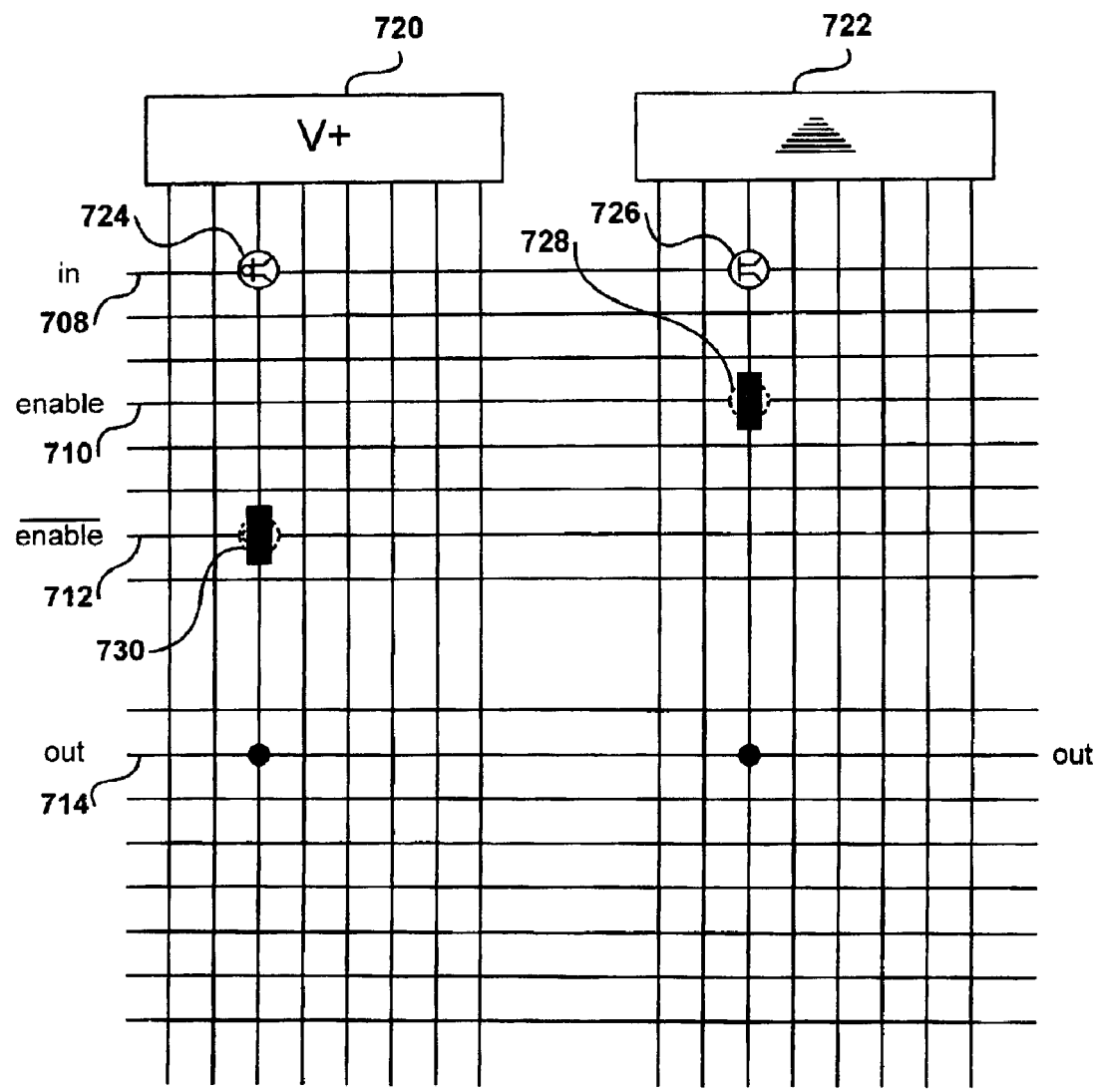
FIGS. 8–9 illustrate operation of the 3-state inverter shown in FIG. 7.
Figure 9:
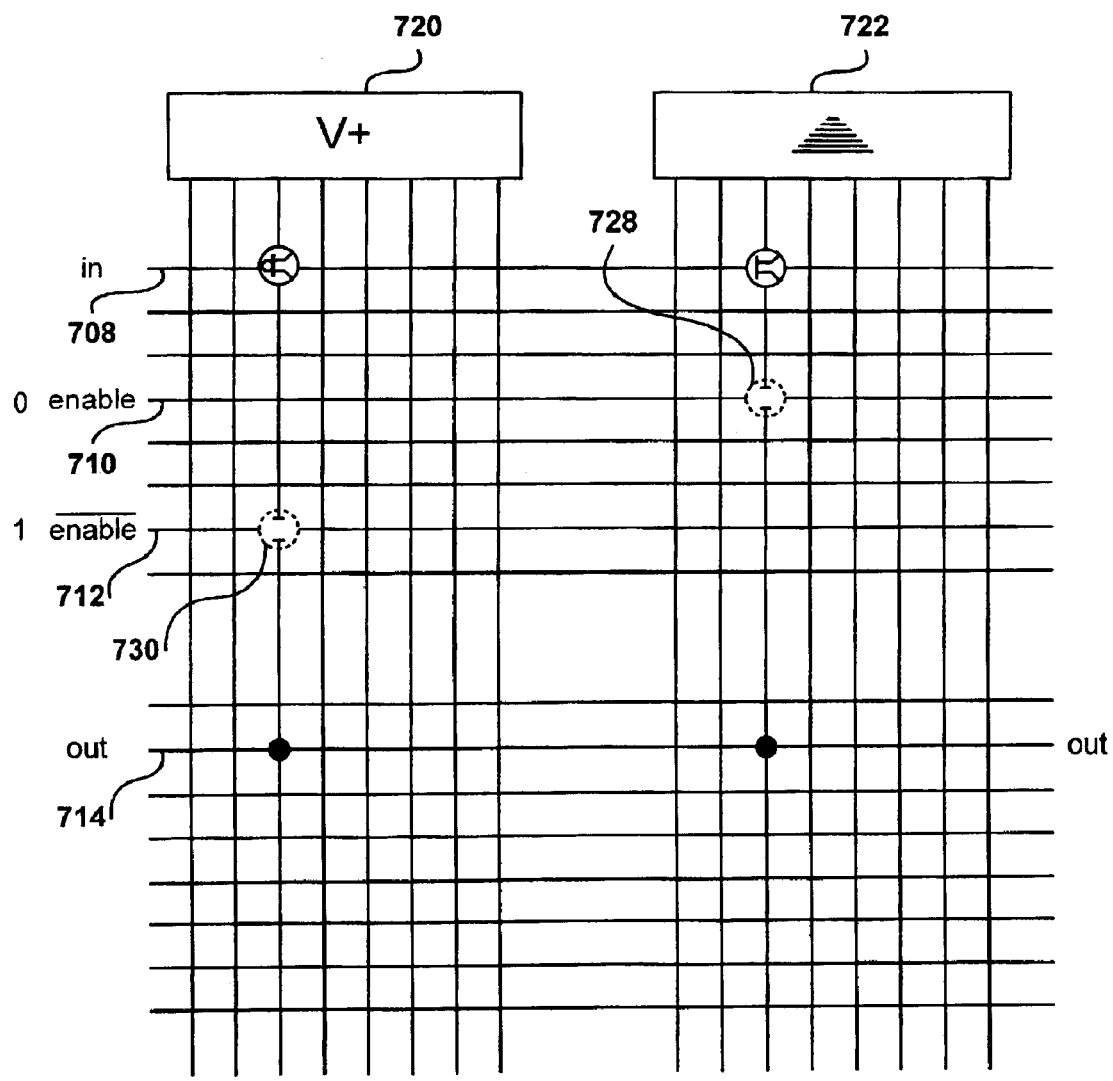

FIGS. 8–9 illustrate operation of the 3-state inverter shown in FIG. 7. When the state of the enable and enable signal lines 710 and 712 is "1" and "0," respectively, pFET 728 is activated, connecting nanowire 710 with nanowire 718, and nFET 730 is also activated, connecting nanowire 712 with nanowire 716. In this case, the state of the output signal line out 714 is determined by the state of the input signal line 708. When the input signal line is low, nFET 724 is activated and pFET 726 is not activated, resulting in interconnection of nanowires 714 and 716 with the positive voltage source 720. By contrast, when the state of the input signal line "in" 708 is high, nFET 724 is not active, while pFET 726 is active. In this case, the output signal line out 714 is interconnected, via vertical nanowire 718, with ground 722. Thus, when the state of the input signal line "in" is "0," the state of the output signal line is "1," while when the state of the input signal line is "1," the state of the output signal line is "0."

When the states of the enable and enable input signal lines are reversed, as shown in FIG. 9, from their states shown in FIG. 8, then neither nFET 730 nor pFET 728 are active. In this case, the output signal line 714 is connected neither to the relatively high-voltage source 720 nor to ground 722, regardless of the state of the input signal line "in," so that the output signal line is undriven, or in a high impedance state "high Z."

The 3-state inverter is particularly useful as a building block for more complex, clock and latch circuitry. When 2-state inverters are employed for such devices, the behavior of latches and flip-flops built from the 2-state inverters may depend on difficult-to-measure, hard-to-control-in-manufacturing characteristics, and may, as a result, appear to behave non-deterministically. In such devices, a variety or race conditions may be inherent, leading to difficult design, configuration, and testing problems. However, because the 3-state inverter provides the high-impedance third state, clock and latch circuits built from 3-state inverters are far less dependent on small changes in physical characteristics, and do not contain the race conditions inherent in similar devices built from 2-state inverters. In essence, clock and latch circuits built from 3-state inverters appear to behave deterministically.

3-state inverter functionality implemented in molecular-junction-nanowire crossbars are even more particularly useful for building clock and latch circuits, and more complex circuits based on combinations of clock, latch, and Boolean circuits. Because of the ease of configuring junctions within molecular-junction-nanowire crossbars, complex circuits based on combinations of clock, latch, and Boolean circuits can be implemented within a single molecular-junction-nanowire crossbar, for example, a CS lattice having various tilings of different types of microregions. Unlike prior techniques, where the complex circuits are configured by combining simpler-circuit components, molecular-junction-nanowire-crossbar implementations allow for composition of such circuits within a single device via junction configuration.

Figures 10A, 10B:
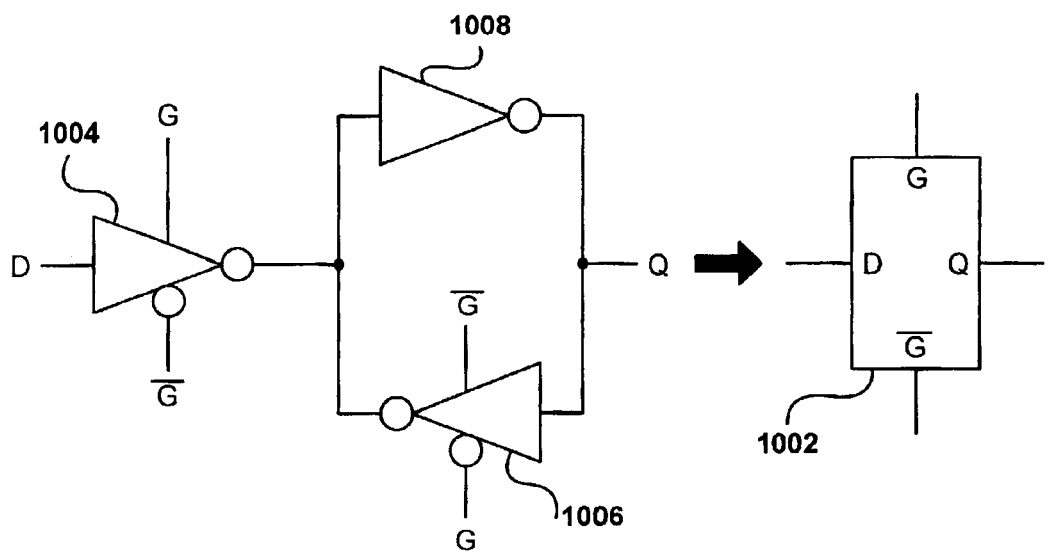
FIGS. 10A–10B show a schematic representation of a transparent latch and a truth table for the transparent latch.

A second, slightly more complex, familiar electronic circuit, the transparent latch, can be constructed from two 3-state inverters and a simple inverter. FIGS. 10A–B show a schematic representation of a transparent latch and a truth table for the transparent latch, respectively. As shown in FIG. 10A, a transparent latch 1002 comprises a first 3-state inverter 1004, a second 3-state inverter 1006, and a simple inverter 1008. As shown in the truth table shown in FIG. 10B, when the input enable lines G and G have states "1" and "0," respectively, then the state of the input signal line D is passed through to the output signal line Q. However, when the states of the enable input signal lines G and G are reversed, as seen in the lower two rows of FIG. 10B, then the previous state of the output signal line Q is maintained. If the state of the output signal Q line was "0" prior to switching G and G from "1" and "0," respectively, to "0" and "1," then the state of the output signal line Q remains "0." Conversely, if the state of the output signal line Q was "1," then the state of the output signal line Q remains "1" following transition of G and G from "1" and "0" to "0" and "1," respectively.

Figure 11:
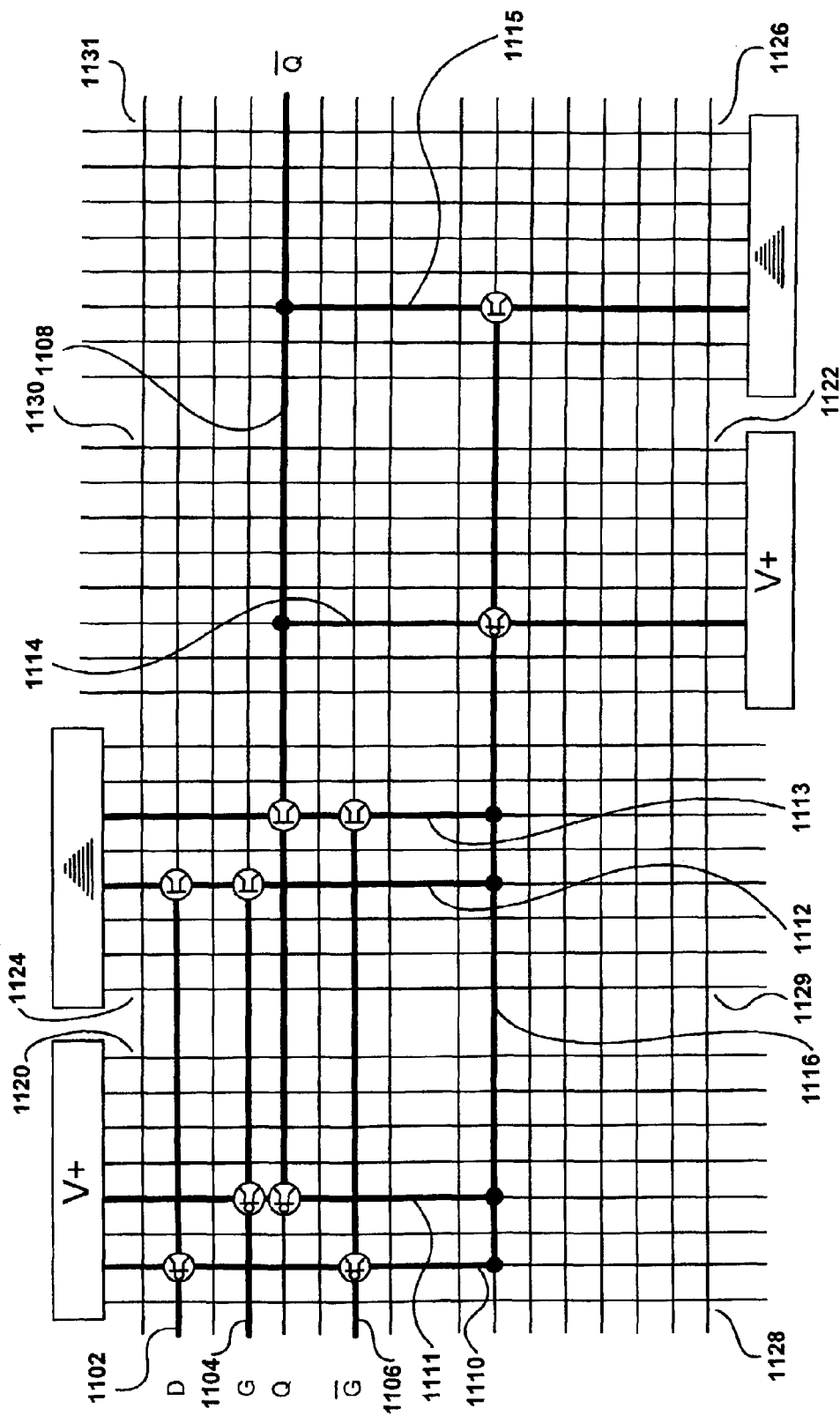
FIG. 11 illustrates implementation of a transparent latch in a molecular-junction-nanowire crossbar.

FIG. 11 illustrates implementation of a transparent latch in a molecular-junction-nanowire crossbar. In this implementation, the input is inverted from that shown in FIG. 10B. In other words, the implemented transparent latch outputs Q. Two side-by-side CS lattices are interconnected, with inversion and mirroring of one of the CS lattices, as shown in FIG. 11. Three horizontal nanowires 1102, 1104, and 1106 are chosen for input signal lines D, G, and G, respectively. A fourth horizontal nanowire 1108 is chosen for the output signal line $\overline{Q}$. These four horizontal nanowires are interconnected via selectively configured pFETs, nFETs, and connections, to six vertical nanowires 1110–1115 and with an additional horizontal nanowire 1117. As can be seen in FIG. 11, microregions 1120 and 1122 are prepared for selective configuration of nFETs, microregions 1124 and 1126 are prepared for selective configuration of pFETs, and the remaining microregions 1128–1131 are prepared for selective configuration of connections.

Figure 12A:
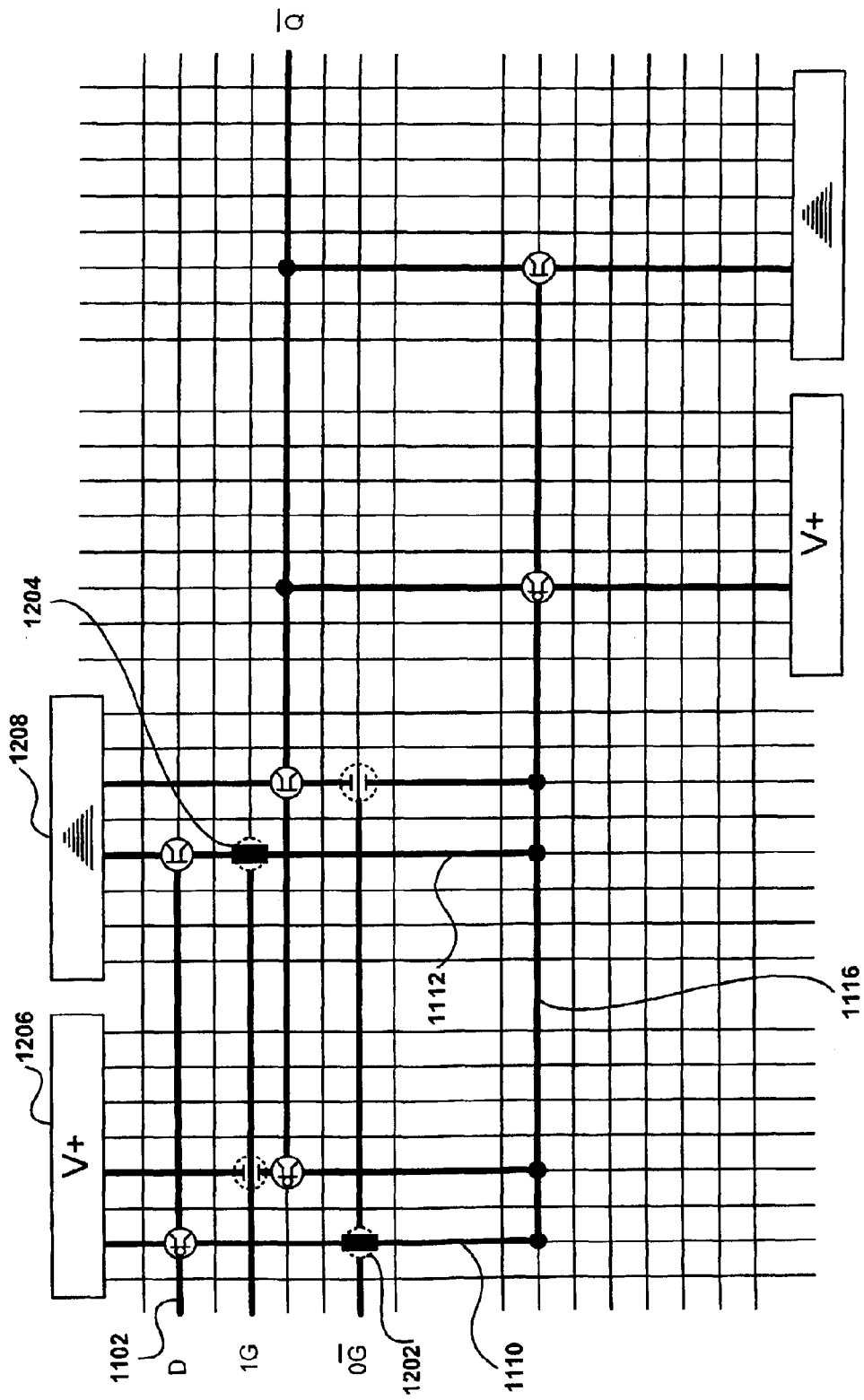
FIGS. 12A–12C illustrate operation of the transparent latch, shown in FIG. 11, when the input enable input lines G and $\overline{G}$ are in the states "1" and "0," respectively.
Figure 12B:
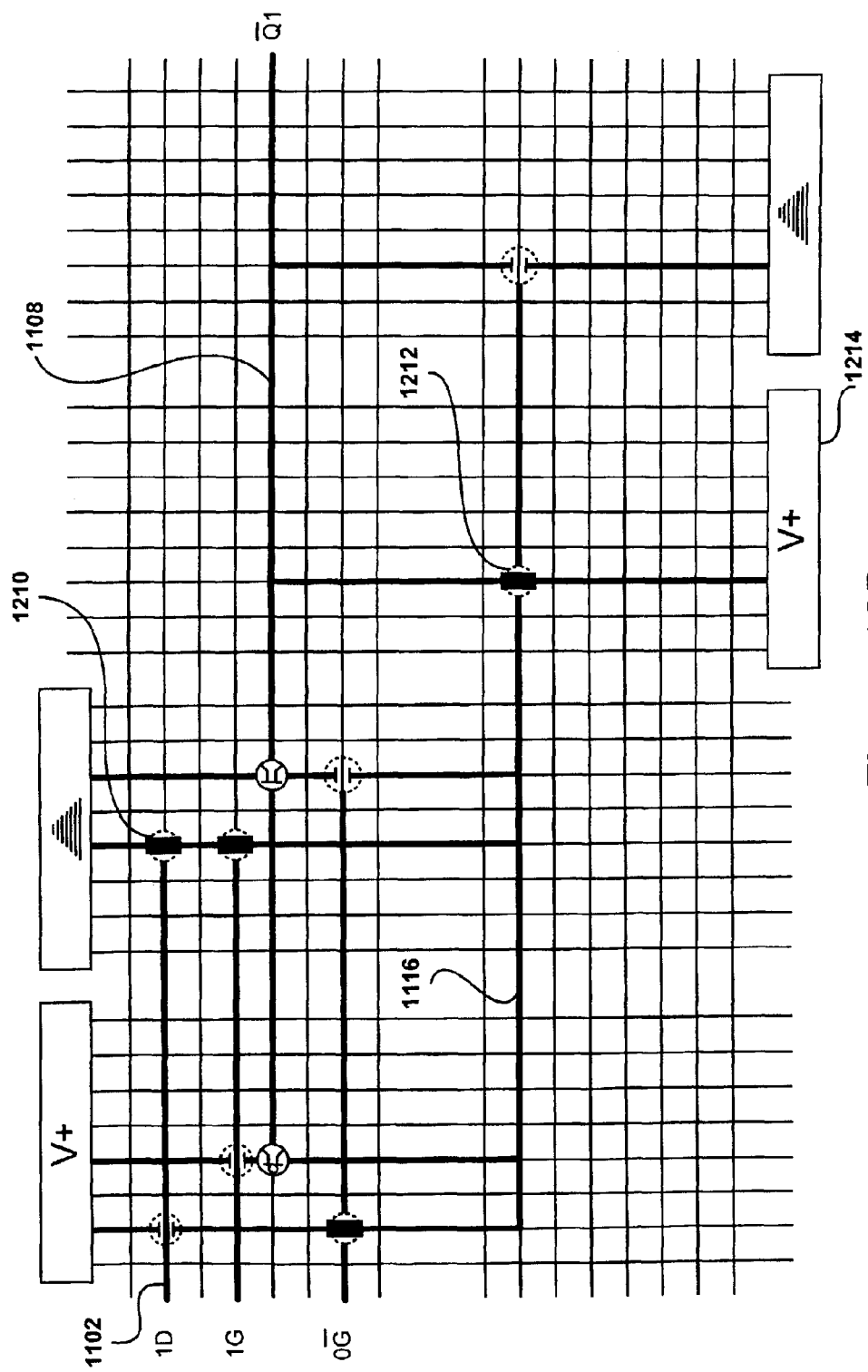
Figure 12C:
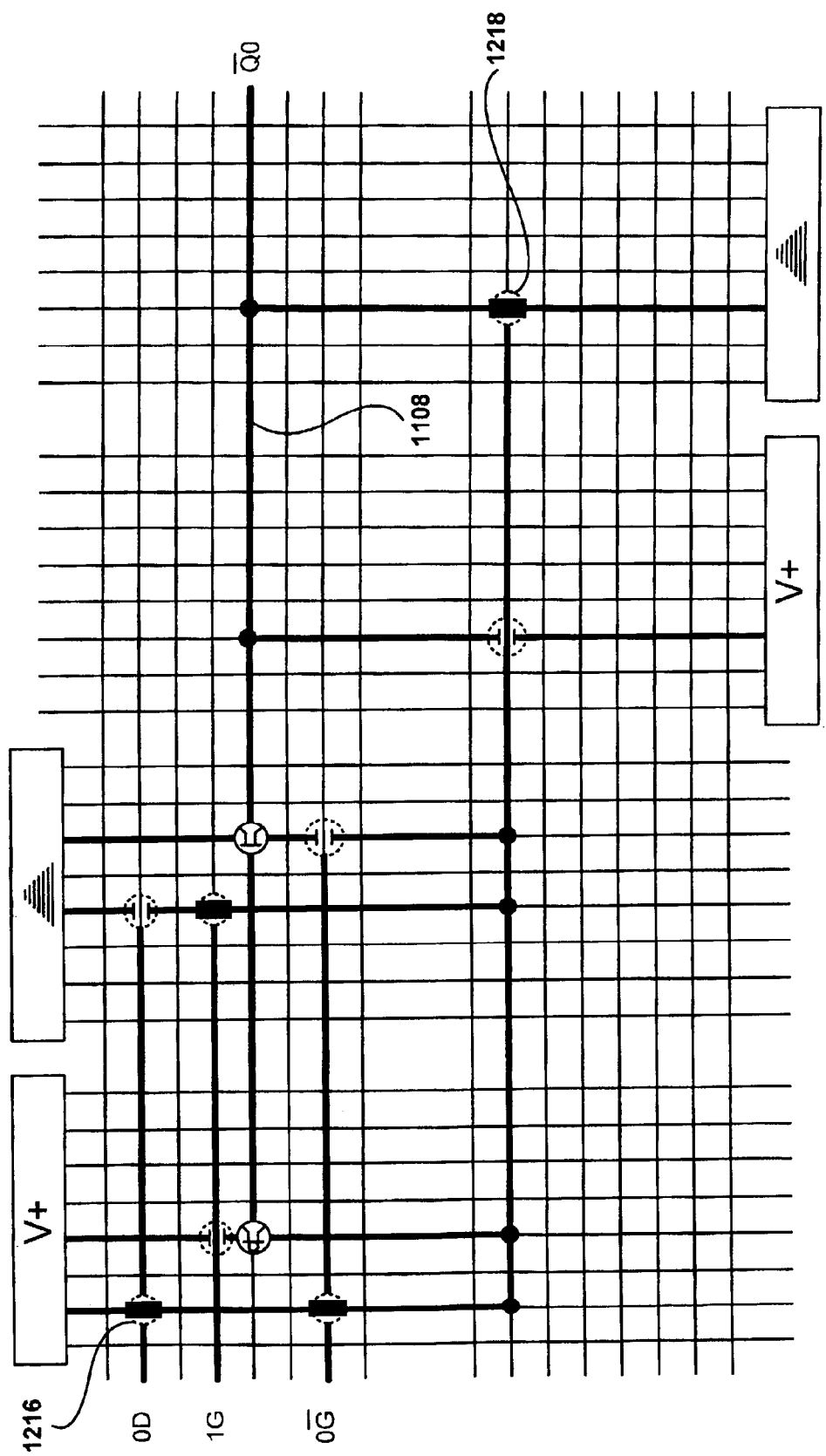

FIGS. 12A–C illustrate operation of the transparent latch, shown in FIG. 11, when the input enable input lines G and $\overline{G}$ are in the states "1" and "0," respectively. As shown in FIG. 12A, when the enable signal lines G and $\overline{G}$ are in the states "1" and "0," respectively, nFET 1202 is active and pFET 1204 is active, potentially interconnecting horizontal nanowire 1116 with a relatively high-voltage source 1206 and ground 1208 via vertical nanowires 1110 and 1112. Thus, the state of the horizontal nanowire 1116 is determined by the state of input signal line D 1102. As shown in FIG. 12B, when the state of input signal line D 1102 is "1," pFET 1210 is activated, shorting horizontal nanowire 1116 to ground, in turn activating nFET 1212, which connects the output signal line $\overline{Q}$ 1108 to a relatively high-voltage source 1214. Conversely, as shown in FIG. 12C, when the state of the input sign line D 1102 is "0," then nFET 1216 is activated, placing horizontal nanowire 1116 in the state "1," which in turn activates nFET 1218, shorting output signal line Q 1108 to ground. Thus, when the enable input signals G and $\overline{G}$ have the states "1" and "0," respectively, the output of the transparent latch implemented in the molecular-junction-nanowire crossbar represents inversion of the state of the input line D.

Figure 13A:
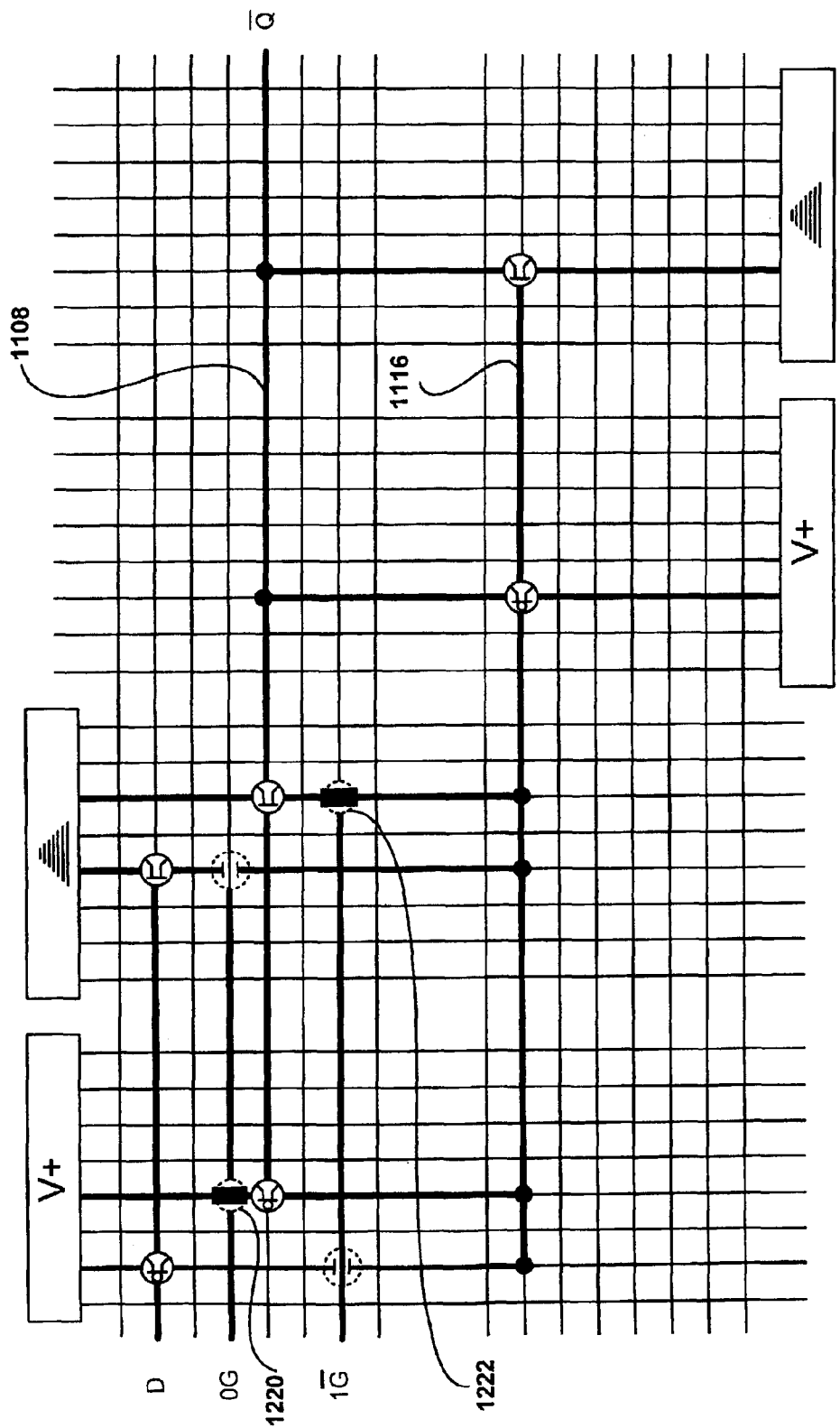
FIGS. 13A–C illustrate operation of the transparent latch, shown in FIG. 11, when the enable input lines G and $\overline{G}$ are in the states "0" and "1," respectively.
Figure 13B:
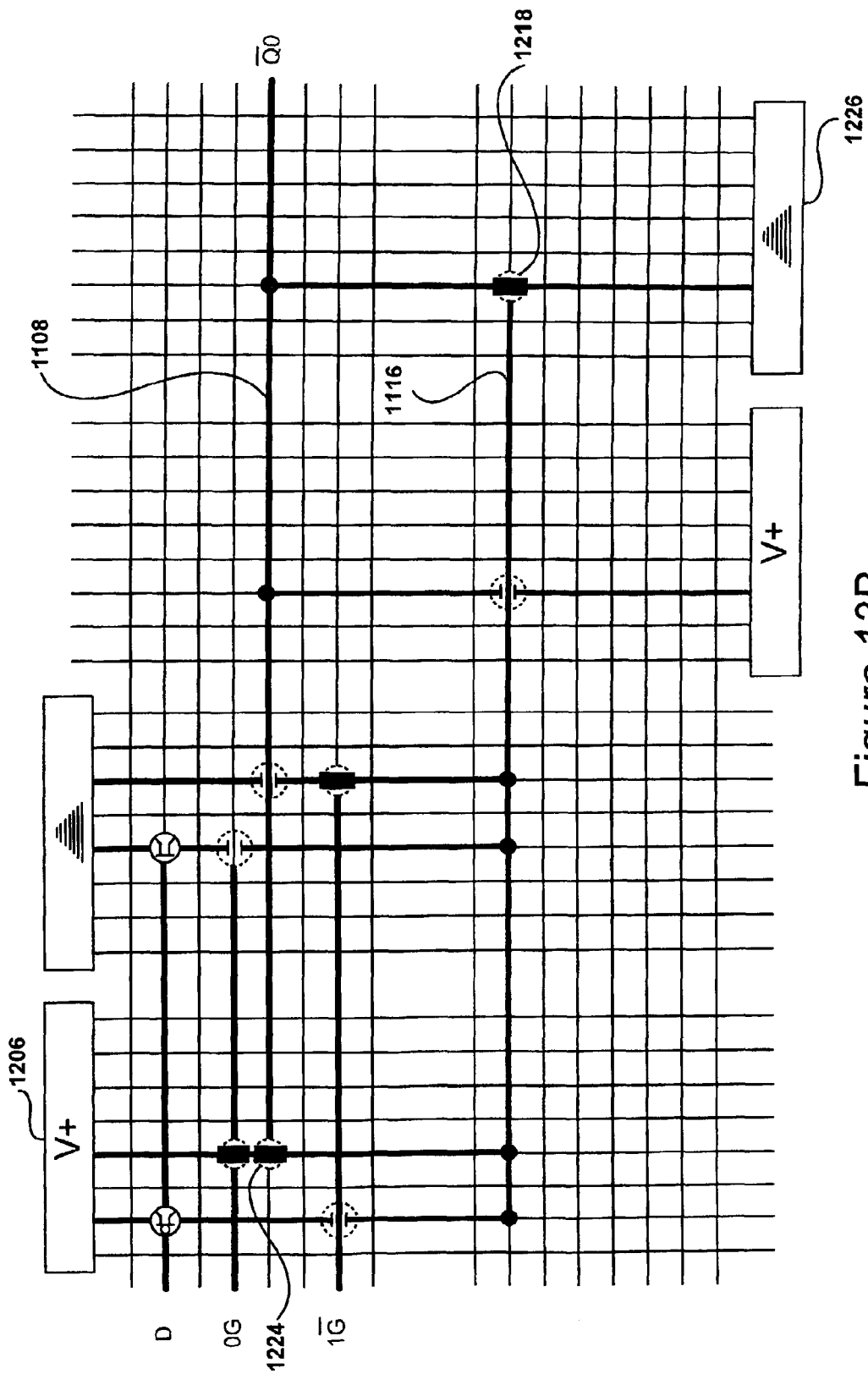
Figure 13C:
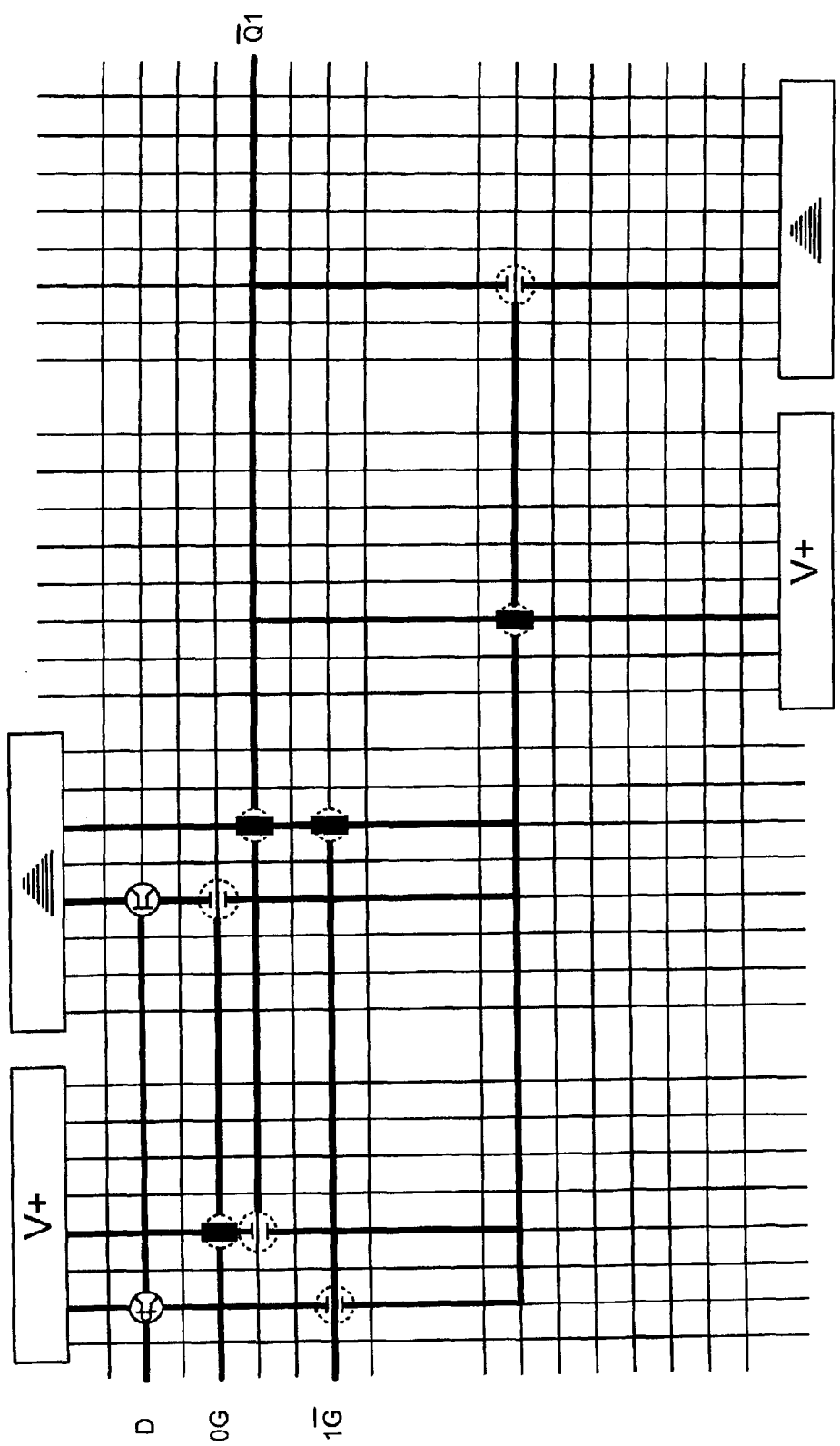

FIGS. 13A–C illustrate operation of the transparent latch, shown in FIG. 11, when the enable input lines G and $\overline{G}$ are in the states "0" and "1," respectively. In this case, as shown in FIG. 13A, nFET 1220 and pFET 1222 are activated, potentially interconnecting the output signal line 1108 with the horizontal nanowire 1116. When, as shown in FIG. 13B, the state of the output signal line $\overline{Q}$ 1108 was "0" prior to transition of the enable signal lines G and $\overline{G}$ from states "1" and "0" to "0" and "1," respectively, then nFET 1224 is active, now interconnecting horizontal nanowire 1116 with the relatively high-voltage source 1206, in turn activating pFET 1218 to short output signal line 1108 to ground 1226. Thus output signal line $\overline{Q}$ remains in the state "0." Similarly, as shown in FIG. 13C, when the state of the output signal line $\overline{Q}$ was previously "1," then the state of the output signal line $\overline{Q}$ remains 1 following transition of enable input signal lines G and $\overline{G}$ from states "1" and "0" to "0" and "1," respectively. Thus, as shown in FIGS. 12–13, the molecular-wire-lattice-based implementation of the transparent latch, with inversion, follows the truth table shown in FIG. 10B, with the exception that the transparent latch with inversion inverts the input signal during the enable condition.

Figure 14A:
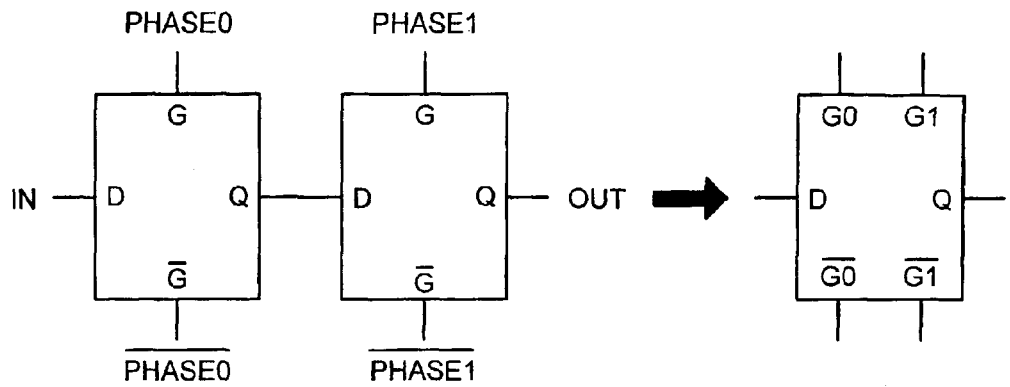
FIG. 14A shows a schematic for the combination of two transparent latches to form a master/slave flip-flop.
Figure 14B:
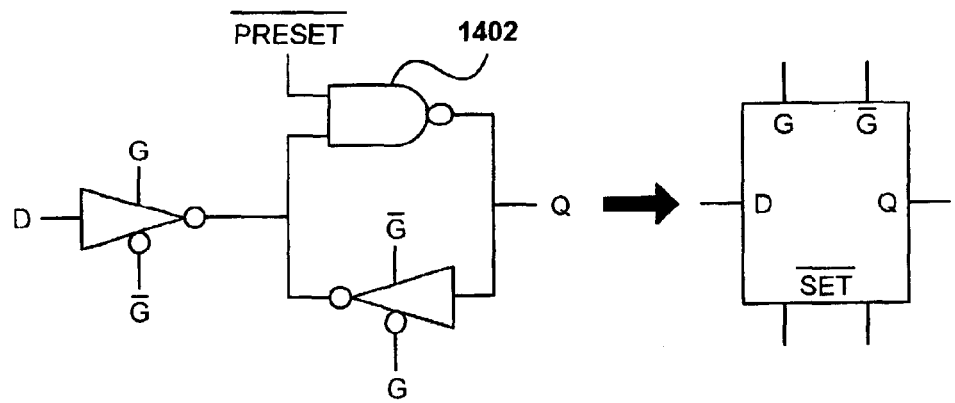
FIG. 14B shows a modification of the transparent latch, as shown in FIG. 10A, with a NAND component replacing the simple inverter (1008 in FIG. 10A) to produce a transparent latch with asynchronous preset.
Figure 14D:
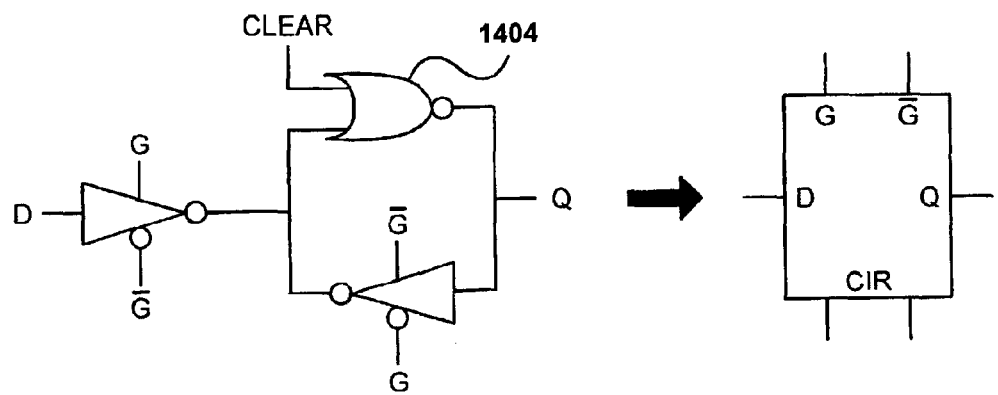
FIG. 14D shows a modification of the transparent latch, as shown in FIG. 10A, with a NOR element replacing the simple inverter (1008 in FIG. 10A) to produce a transparent latch with asynchronous clear.
Figure 14C:
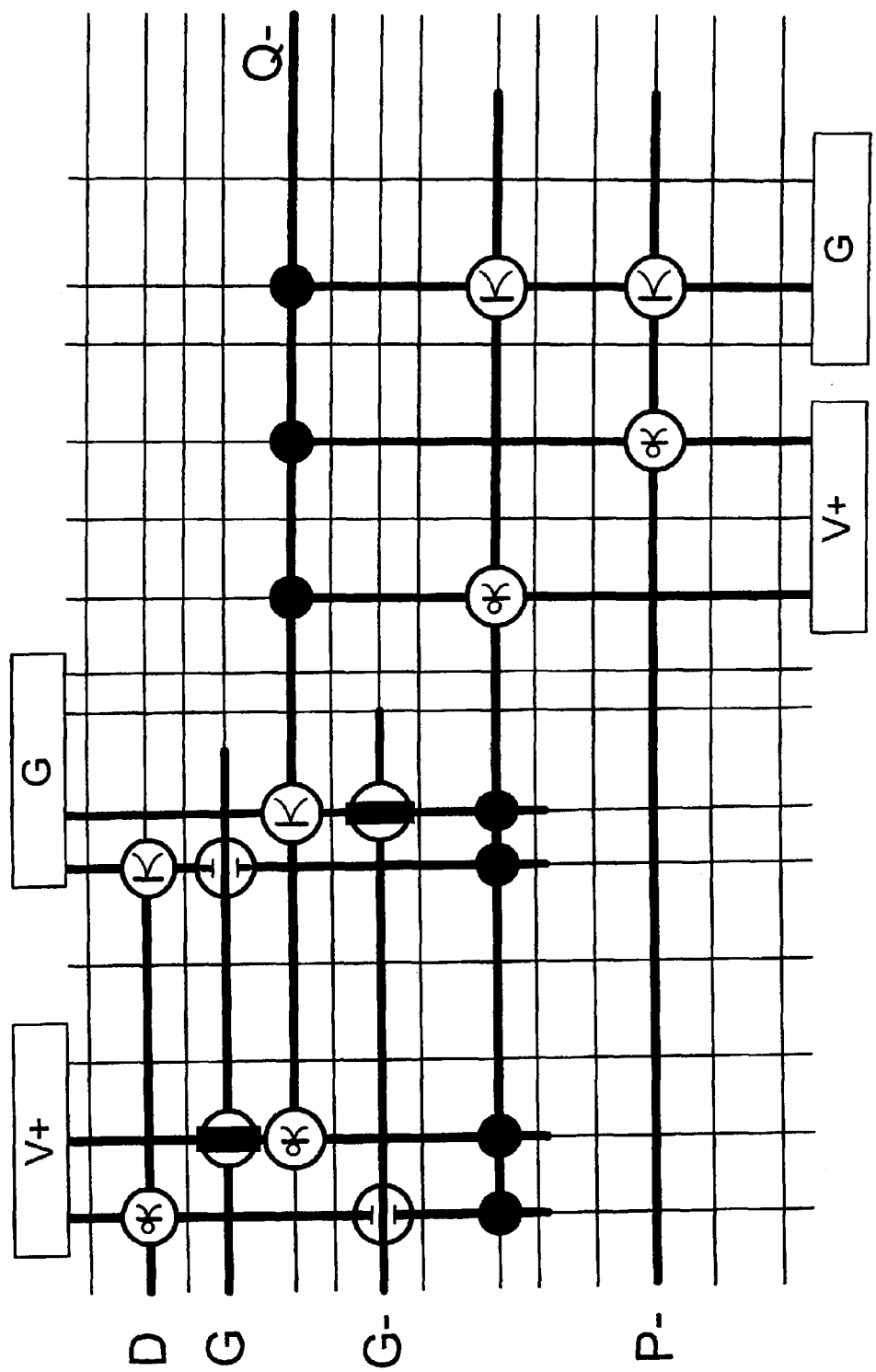
FIG. 14C shows a full CS-lattice implementation of the transparent latch with asynchronous preset.
Figure 14E:
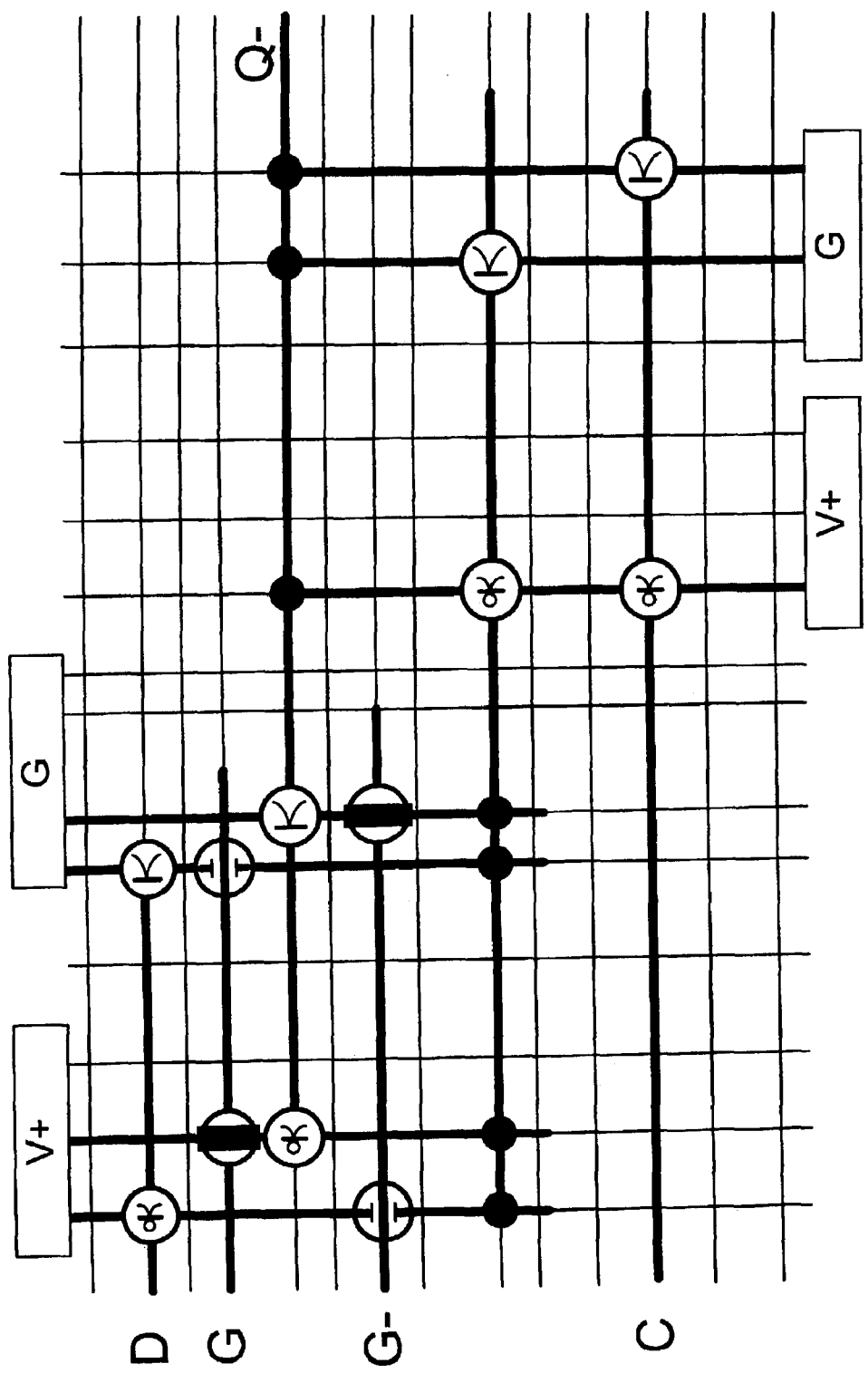
FIG. 14E shows a full CS-lattice implementation of the transparent latch with asynchronous clear.
Figure 15A:
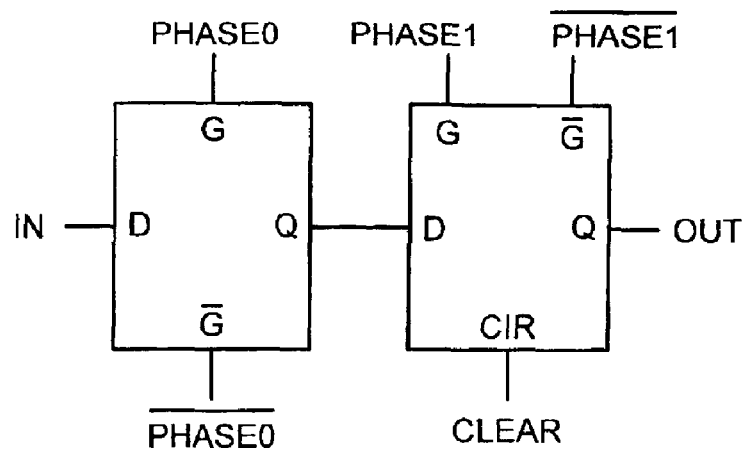
FIGS. 15A and 15B show a combination of a transparent latch and a transparent latch with asynchronous clear to produce a master/slave flip-flop with asynchronous clear.
Figure 15B:
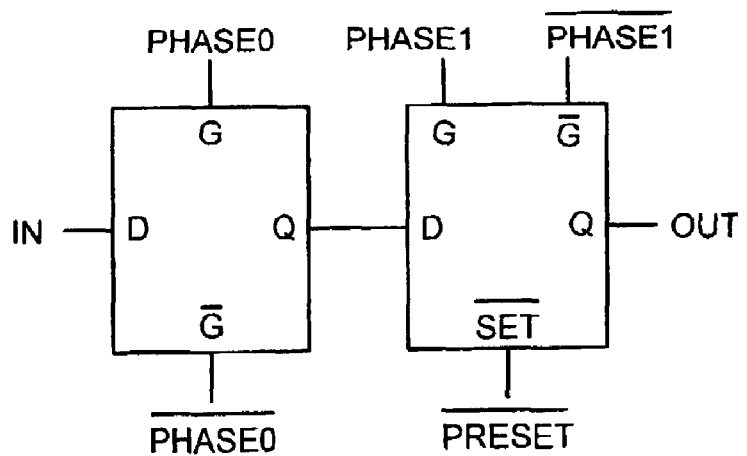

Two transparent latches can be combined to form a mater/slave flip-flop. FIG. 14A shows a schematic for the combination of the two transparent latches to form a master/slave flip-flop. FIG. 14B shows a modification of the transparent latch, as shown in FIG. 10A, with a NAND component replacing the simple inverter (1008 in FIG. 10A) to produce a transparent latch with asynchronous preset. FIG. 14C shows a full CS-lattice implementation of the transparent latch with asynchronous preset. FIG. 14D shows a modification of the transparent latch, as shown in FIG. 10A, with a NOR element replacing the simple inverter (1008 in FIG. 10A) to produce a transparent latch with asynchronous clear. FIG. 14E shows a full CS-lattice implementation of the transparent latch with asynchronous clear. FIGS. 15A and 15B show a combination of a transparent latch and a transparent latch with asynchronous clear to produce a master/slave flip-flop with asynchronous clear. FIG. 15B shows combination of a transparent latch with a transparent latch with asynchronous reset to produce a master/slave flip-flop with asynchronous preset. Thus, as shown in FIGS. 14–15, the molecular-wire-lattice implementations of a 3-state inverter, as shown in FIG. 7, and a transparent latch, as shown in FIG. 11, can be variously combined, with appropriate combination tilings of CS lattices, to produce a variety of useful enhanced transparent latches, flip-flops, and enhanced flip-flops. In similar fashion, an almost limitless variety of electronic circuits can be fashioned by selective configuration of simple electronic components within molecular-junction-nanowire crossbars.

Molecular-junction-nanowire crossbars are quite defect and fault tolerant, and can be configured using a variety of different topologies. Molecular-junction-nanowire crossbar implementations of circuits consume very little power, and have extremely high densities. These extremely dense circuits can then be combined into extremely dense subsystems that include many additional electrical components, implemented within a set of CS lattices. Thus, rather than simply representing a miniaturization of existing electronic circuits, in isolation, the present invention provides for building electronic circuits into complex subsystems having transistor densities equal to, or greater than, 1 billion transistors/$cm^2$ or, in other words, having 1.0 giga-transistor/$cm^2$ densities and greater transistor densities.

Although the present invention has been described in terms of a particular embodiment, it is not intended that the invention be limited to this embodiment. Modifications within the spirit of the invention will be apparent to those skilled in the art. For example, different combinations of selective configuration of pFETs, nFETs, connections, and other simple electrical components within different types of molecular-junction-nanowire crossbars may produce equivalent circuits to those implemented in FIGS. 7 and 11. An almost limitless variety of electronic circuits can be fashioned by selective configuration of simple electrical components at molecular-wire-lattice points.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A nanoscale 3-state inverter comprising:
  a molecular-junction-nanowire crossbar;
  an input nanowire signal line in;
  an enable input nanowire signal line and its input nanowire signal line complement $\overline{enable}$;

an output nanowire signal line out; and junction components programmed into the molecular-junction-nanowire crossbar.

2. The nanoscale 3-state inverter of claim 1 implemented in a complementary/symmetry lattice additionally including other nanoscale components that, together with the nanoscale 3-state inverter, compose an electrical subsystem.

3. The electrical subsystem of claim 2 wherein the nanoscale components are configured together at densities within the electrical subsystem at densities greater than 1.0 giga-transistors/cm².

4. The nanoscale 3-state inverter of claim 2 wherein transistors and connections are selectively configured at junctions of the molecular-junction-nanowire crossbar to invert a signal on the input nanowire signal line in and output the inverted signal to the output nanowire signal line out when the enable input nanowire signal line is in an ON state and $\overline{enable}$ input nanowire signal line is in an OFF state, and to place the output nanowire signal line out into a high impedance state when the enable input nanowire signal line is in an OFF state or the $\overline{enable}$ input nanowire signal line is in an ON state.

5. The nanoscale 3-state inverter of claim 1 wherein in is potentially interconnected to a relatively high-voltage source and to out via an nFET, and in is potentially interconnected to ground and to out via a pFET.

6. The nanoscale 3-state inverter of claim 1 wherein enable is potentially interconnected to a ground, to in, and to out via an pFET, and $\overline{enable}$ is potentially interconnected to a high-voltage source, to out, and to in via a nFET.

7. The nanoscale 3-state inverter of claim 1 incorporated into one of a nanoscale latch and a nanoscale flip-flop circuit implemented within the molecular-junction-nanowire crossbar.

8. The nanoscale 3-state inverter of claim 7, incorporated into one of a nanoscale latch and a nanoscale flip-flop circuit implemented within the molecular-junction-nanowire crossbar, further incorporated into a more complex circuit that includes Boolean logic circuitry.

9. The nanoscale 3-state inverter of claim 1 wherein microscale non-semiconductive signal lines are used in place of nanoscale non-semiconductive signal lines.

10. A nanoscale latch comprising:

a molecular-junction-nanowire crossbar;

an input nanowire signal line;

an enable input nanowire signal line;

an output nanowire signal line; and junction components programmed into the molecular-junction-nanowire crossbar to invert the input nanowire signal line to the output nanowire signal line when the enable input nanowire signal line is in an ON state and otherwise maintain the state of the output nanowire signal line.

11. The nanoscale latch of claim 10 implemented in a complementary/symmetry lattice additionally including other nanoscale components that, together with the nanoscale latch, compose an electrical subsystem.

12. The electrical subsystem of claim 11 wherein the nanoscale components are configured together at densities within the electrical subsystem at densities greater than 1.0 giga-transistors/cm².

13. The nanoscale latch of claim 10 wherein microscale non-semiconductive signal lines are used in place of nanoscale non-semiconductive signal lines.

14. A nanoscale inverting transparent latch comprising:

a molecular-junction-nanowire crossbar;

an input nanowire signal line D;

an enable input nanowire signal line G and its input nanowire signal line complement $\overline{G}$;

an output nanowire signal line $\overline{Q}$; and pFETs, nFETs, and connections selectively configured at molecular-junction-nanowire crossbar junctions to invert the input nanowire signal line D to the output nanowire signal line $\overline{Q}$ when the enable input nanowire signal line G is in an ON state and its complement input nanowire signal line $\overline{G}$ is in an OFF state, and, when G is in an OFF state and $\overline{G}$ is in an ON state, maintain the state of output nanowire signal line $\overline{Q}$.

15. The nanoscale inverting transparent latch of claim 14 wherein microscale non-semiconductive signal lines are used in place of nanoscale non-semiconductive signal lines.

16. A nanoscale flip-flop comprising:

a molecular-junction-nanowire crossbar;

a first nanoscale latch programmed into the molecular-junction-nanowire crossbar to produce an output nanowire signal line; and a second nanoscale latch programmed into the molecular-junction-nanowire crossbar to receive, as an input nanowire signal line, a signal on the output nanowire signal line output by the first nanoscale latch.

17. The nanoscale flip-flop of claim 16 implemented in a complementary/symmetry lattice additionally including other nanoscale components that, together with the nanoscale flip-flop, compose an electrical subsystem.

18. The electrical subsystem of claim 17 wherein the nanoscale components are configured together at densities within the electrical subsystem at densities greater than 1.0 giga-transistors/cm².

19. The nanoscale flip-flop of claim 16 wherein microscale non-semiconductive signal lines are used in place of nanoscale non-semiconductive signal lines.

20. A nanoscale master/slave flip-flop comprising:

a first nanoscale inverting transparent latch producing an output nanowire signal line; and a second nanoscale inverting transparent latch receiving, as an input nanowire signal line, a signal on the output nanowire signal line output by the first nanoscale inverting transparent latch.

21. The nanoscale master/slave flip-flop of claim 20 wherein microscale non-semiconductive signal lines are used in place of nanoscale non-semiconductive signal lines.

22. A nanoscale latch with asynchronous preset comprising:

a first nanoscale 3-state inverter;

a nanoscale nand circuit receiving, as input, a signal output from the first nanoscale 3-state inverter; and a second nanoscale 3-state inverter receiving, as input, a signal output from the nanoscale nand circuit and outputting a signal input to the nanoscale nand circuit.

23. The nanoscale latch with asynchronous preset of claim 22 wherein microscale non-semiconductive signal lines are used in place of nanoscale non-semiconductive signal lines.

24. A nanoscale latch with asynchronous clear comprising:

a first nanoscale 3-state inverter;

a nanoscale nor circuit receiving, as input, a signal output from the first nanoscale 3-state inverter; and a second nanoscale 3-state inverter receiving, as input, a signal output from the nanoscale nor circuit and outputting a signal input to the nanoscale nor circuit.

25. The nanoscale latch with asynchronous clear of claim 24 wherein microscale non-semiconductive signal lines are used in place of nanoscale non-semiconductive signal lines.

26. A nanoscale master/slave flip-flop with asynchronous clear comprising;
   a nanoscale inverting transparent latch producing an output on a nanoscale output signal line; and
   a nanoscale latch with asynchronous clear receiving, as input, a signal on the output nanowire signal line output by the nanoscale inverting transparent latch.

27. A nanoscale master/slave flip-flop with asynchronous $\overline{\text{preset}}$ comprising;
   a nanoscale inverting transparent latch producing an output on a nanoscale output signal line; and
   a nanoscale latch with asynchronous $\overline{\text{preset}}$ receiving, as input, a signal on the output nanowire signal line output by the nanoscale inverting transparent latch.

28. A nanoscale state-preserving electronic circuit comprising:
   a molecular-junction-nanowire crossbar;
   at least one input nanowire signal line;
   at least one output nanowire signal line; and
   transistors and connections selectively configured, at junctions within the molecular-junction-nanowire crossbar, to implement at least one 3-state inverter used, along with one of additional Boolean logic, one or more additional 3-state inverters, and a combination of additional Boolean logic and one or more additional 3-state inverters, to implement, within the molecular-junction-nanowire crossbar, a state-preserving circuit.

29. The nanoscale state-preserving electronic circuit of claim 28 wherein the nanoscale state-preserving electronic circuit is one of a number of different nanoscale state-preserving electronic circuits including:
   a transparent latch;
   a master/slave flip-flop;
   a transparent latch with asynchronous preset;
   a transparent latch with asynchronous clear;
   a master/slave flip-flop with asynchronous clear;
   a master/slave flip-flop with asynchronous preset;
   a transparent latch with additional logic circuitry;
   a master/slave flip-flop with additional logic circuitry;
   a transparent latch with asynchronous preset with additional logic circuitry;
   a transparent latch with asynchronous clear with additional logic circuitry;
   a master/slave flip-flop with asynchronous clear with additional logic circuitry; and
   a master/slave flip-flop with asynchronous preset with additional logic circuitry.

30. The nanoscale state-preserving electronic circuit of claim 29 wherein microscale non-semiconductive signal lines are used in place of nanoscale non-semiconductive signal lines.

* * * * *